US012648252B2

(12) United States Patent
Choi et al.

(10) Patent No.: US 12,648,252 B2
(45) Date of Patent: Jun. 2, 2026

(54) IMAGE SENSORS AND METHODS OF FABRICATING THE SAME

(71) Applicant: Samsung Electronics Co., Ltd., Suwon-si (KR)

(72) Inventors: Min-Jun Choi, Hwaseong-si (KR); Wonoh Ryu, Hwaseong-si (KR); Gyuhyun Lim, Suwon-si (KR); Myungjo Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 584 days.

(21) Appl. No.: 17/564,308

(22) Filed: Dec. 29, 2021

(65) Prior Publication Data

US 2022/0375982 A1      Nov. 24, 2022

(30) Foreign Application Priority Data

May 20, 2021      (KR) ........................ 10-2021-0065008

(51) Int. Cl.
*H10F 39/00*            (2025.01)

(52) U.S. Cl.
CPC ......... *H10F 39/811* (2025.01); *H10F 39/014* (2025.01)

(58) Field of Classification Search
CPC ..... H01L 27/14636; H01L 2027/11866; H10F 39/811; H10F 39/014
See application file for complete search history.

(56) References Cited

U.S. PATENT DOCUMENTS

| | | | |
|---|---|---|---|
| 7,115,491 B2 | 10/2006 | Huang et al. | |
| 7,648,871 B2 | 1/2010 | Belyansky et al. | |
| 8,299,541 B2 * | 10/2012 | Lenoble .............. | H10D 62/021 |
| | | | 257/E21.434 |
| 9,385,069 B2 | 7/2016 | Liu et al. | |
| 9,711,605 B2 | 7/2017 | Chuang et al. | |
| 9,871,103 B2 * | 1/2018 | Kim .................. | H01L 27/11807 |
| 10,147,650 B2 | 12/2018 | Kim et al. | |
| 10,304,743 B2 * | 5/2019 | Fukumaki ......... | H01L 29/66575 |
| 10,580,733 B2 * | 3/2020 | Kim .................. | H01L 21/76804 |
| 10,886,404 B2 | 1/2021 | Kim et al. | |
| 11,437,315 B2 * | 9/2022 | Kim ............... | H01L 21/823871 |

(Continued)

FOREIGN PATENT DOCUMENTS

| | | |
|---|---|---|
| KR | 100591162 B1 | 6/2006 |
| KR | 10-2020-0039076 A | 4/2020 |
| KR | 10-2021-0005454 A | 1/2021 |

*Primary Examiner* — Mounir S Amer
*Assistant Examiner* — Alexander Belousov
(74) *Attorney, Agent, or Firm* — Wolf, Greenfield & Sacks, P.C.

(57) ABSTRACT

Disclosed are image sensors and methods of fabricating the same. The image sensor comprises a substrate including a plurality of pixels, a photoelectric conversion region in the substrate at each of the pixels, a gate electrode on the substrate at each of the pixels, an interlayer dielectric layer on the substrate and the gate electrode, and a contact penetrating the interlayer dielectric layer and on the gate electrode. The contact includes a lower part on the gate electrode and an upper part on the lower part and connected to a wiring line on the interlayer dielectric layer. A planar shape of the lower part of the contact is larger than that of the upper part of the contact.

20 Claims, 21 Drawing Sheets

(56) References Cited

U.S. PATENT DOCUMENTS

| | | | |
|---|---|---|---|
| 12,336,346 B2 * | 6/2025 | Sakong | H10H 29/142 |
| 2010/0025773 A1 * | 2/2010 | Lenoble | H01L 23/485 |
| | | | 257/E23.164 |
| 2017/0352622 A1 * | 12/2017 | Fukumaki | H01L 29/0642 |
| 2020/0119067 A1 * | 4/2020 | Choi | H01L 27/14605 |
| 2020/0127034 A1 * | 4/2020 | Zhang | H01L 27/14636 |
| 2021/0005794 A1 * | 1/2021 | Sakong | H10H 20/851 |
| 2022/0375982 A1 * | 11/2022 | Choi | H01L 27/14636 |

* cited by examiner

FIG. 2

—IMD

—ILD

—GCLP(GEC)

—GP

—SP

ACT

CDL1
ILD1
GE
GP
SP
SB

OP1

GI

B'

B

CDL1
ILD1
GE
GP
SP
SB

IM

GI

ACT

IMAGE SENSORS AND METHODS OF FABRICATING THE SAME

CROSS-REFERENCE TO RELATED APPLICATION

This U.S. non-provisional application claims priority under 35 U.S.C § 119 to Korean Patent Application No. 10-2021-0065008 filed on May 20, 2021, in the Korean Intellectual Property Office, the disclosure of which is hereby incorporated by reference in its entirety.

FIELD

The present disclosure relates to image sensors and methods of fabricating the same, and more particularly, to image sensors including a contact and methods of fabricating the same.

BACKGROUND

An image sensor is a semiconductor device that transforms optical images into electrical signals. The image sensor may be classified as a charge coupled device (CCD) type or a complementary metal oxide semiconductor (CMOS) type. The CIS (CMOS image sensor) may refer to a CMOS type image sensor. The CIS may include a plurality of two-dimensionally arranged pixels. Each of the pixels includes a photodiode (PD). The photodiode functions to transform incident light into an electrical signal.

SUMMARY

Some aspects of the present inventive concepts provide image sensors whose electrical properties are improved and methods of fabricating the same.

Some aspects of the present inventive concepts provide image sensors whose reliability and integration are increased and methods of fabricating the same.

According to some example embodiments of the present inventive concepts, an image sensor may comprise: a substrate including a plurality of pixels. The pixels may respectively comprise a photoelectric conversion region in the substrate; a gate electrode on the substrate; an interlayer dielectric layer on the substrate and the gate electrode; and a contact penetrating the interlayer dielectric layer and extending on the gate electrode. The contact may include: a lower part on the gate electrode; and an upper part on the lower part and electrically connected to a wiring line on the interlayer dielectric layer. A planar shape of the lower part of the contact may be larger than a planar shape of the upper part of the contact.

According to some example embodiments of the present inventive concepts, an image sensor may comprise: a substrate including a plurality of pixels. The pixels may respectively comprise a photoelectric conversion region in the substrate; a transfer gate electrode and a source follower gate electrode on a top surface of the substrate; a floating diffusion region in the substrate on one side of the transfer gate electrode; a source/drain region in the substrate on one side of the source follower gate electrode; an interlayer dielectric layer on the substrate, the transfer gate electrode, and the source follower gate electrode; a wiring line on the interlayer dielectric layer; and a contact vertically penetrating the interlayer dielectric layer to electrically connect the wiring line to the source follower gate electrode. The contact may include: a vertical part extending from a bottom surface of the wiring line toward a top surface of the source follower gate electrode; and a horizontal part on a bottom end of the vertical part and extending away from the vertical part along the top surface of the source follower gate electrode.

According to some example embodiments of the present inventive concepts, a method of fabricating an image sensor may comprise: forming a source follower gate electrode on a top surface of a substrate; forming a gate protection layer conformally extending on the source follower gate electrode; patterning the gate protection layer to form a first opening that exposes a top surface of the source follower gate electrode; forming a metal material in the first opening to form a first conductive part; forming a first dielectric layer on the gate protection layer; patterning the first dielectric layer to form a second opening that exposes a top surface of the first conductive part; and forming the metal material in the second opening to form a second conductive part. An area of the first opening may be greater than an area of the second opening. The first conductive part and the second conductive part may define a unitary body formed of the metal material.

BRIEF DESCRIPTION OF THE DRAWINGS

FIGS. 2, 3, and 4 are cross-sectional views illustrating an image sensor according to some embodiments of the present inventive concepts.

FIGS. 14, 15, 16, 17, 18, 19, 20, and 21 are cross-sectional views illustrating a method of fabricating an image sensor according to some embodiments of the present inventive concepts.

DETAILED DESCRIPTION

The following will now describe an image sensor according to the present inventive concepts with reference to the accompanying drawings.

Figure 1:
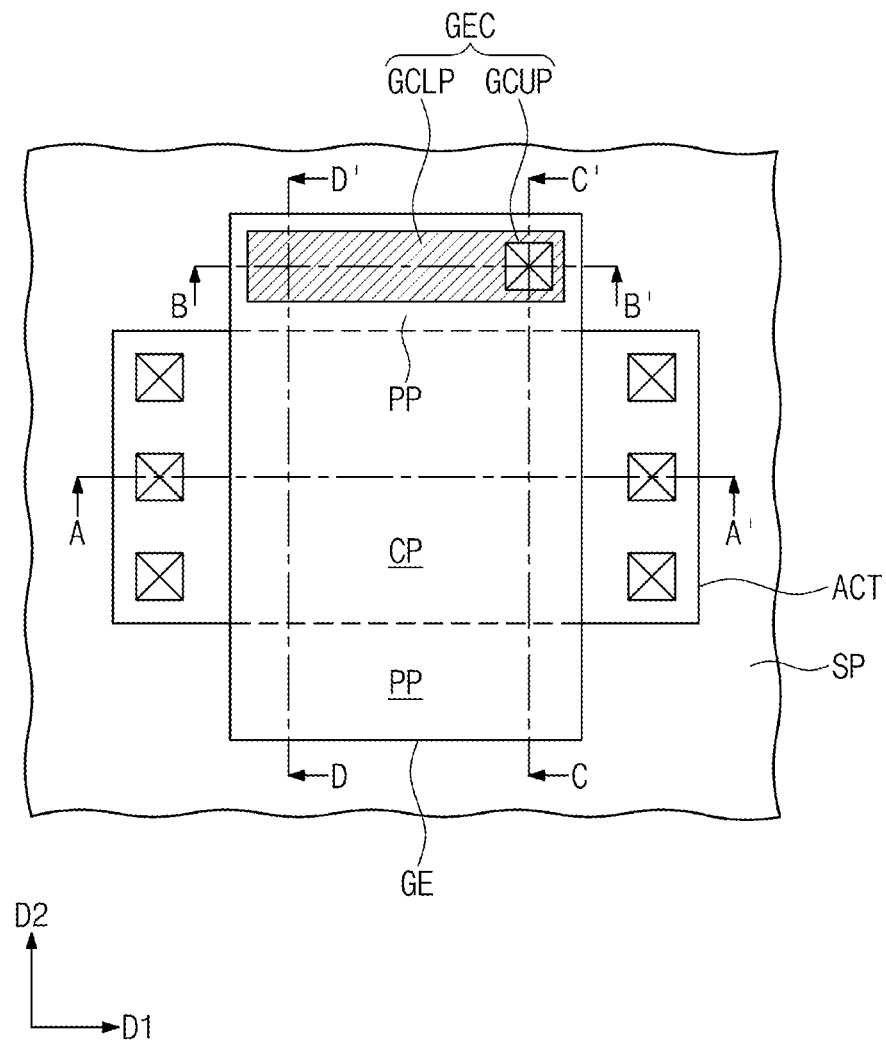
FIG. 1 is a plan view illustrating an image sensor according to some embodiments of the present inventive concepts.
Figure 2:
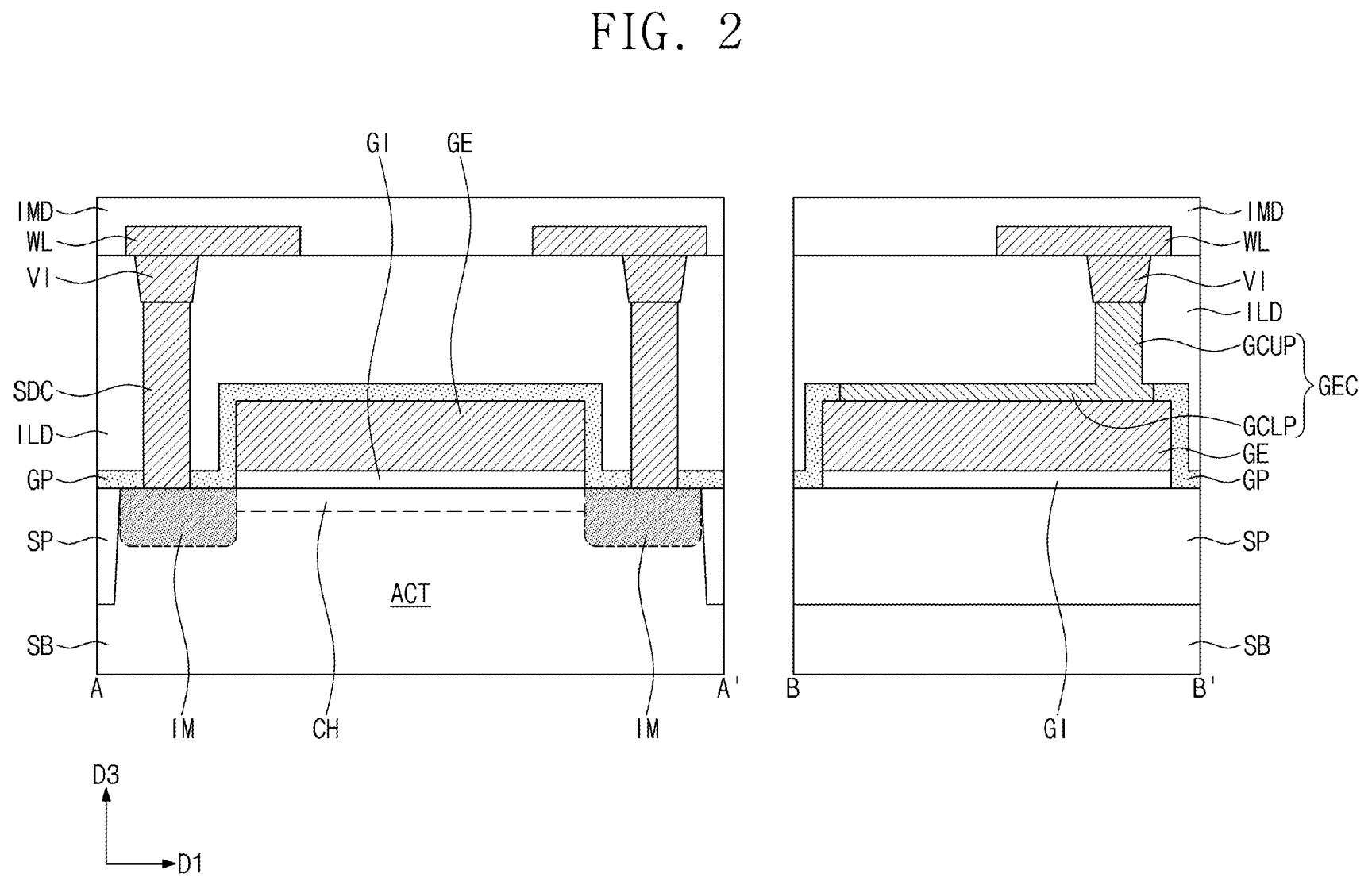
Figure 3:
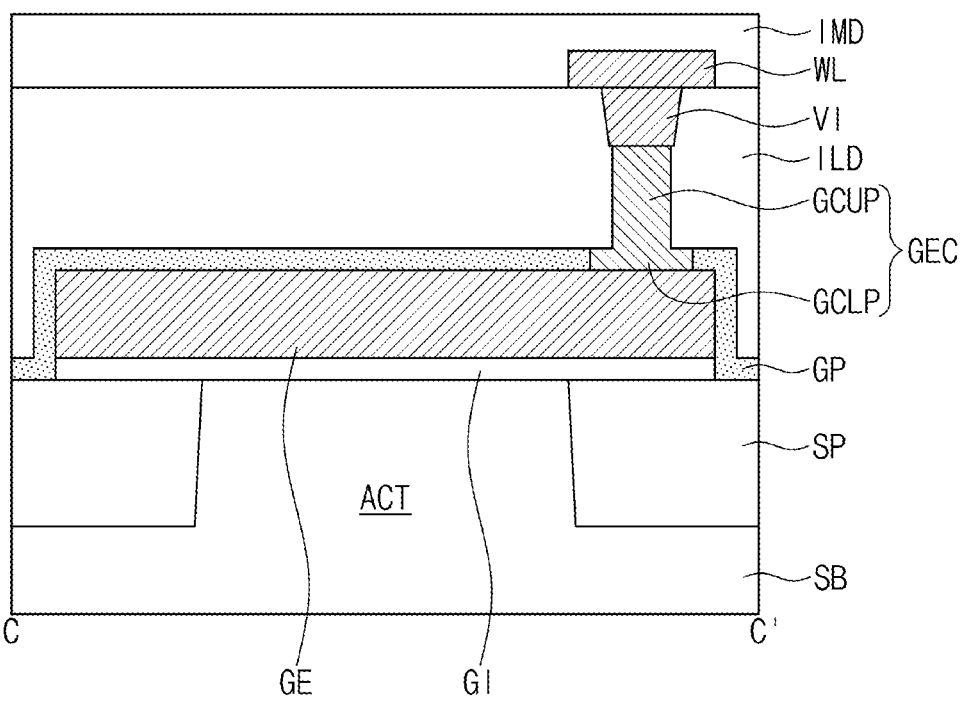
Figure 3:
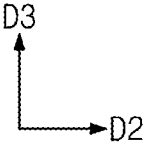
Figure 4:
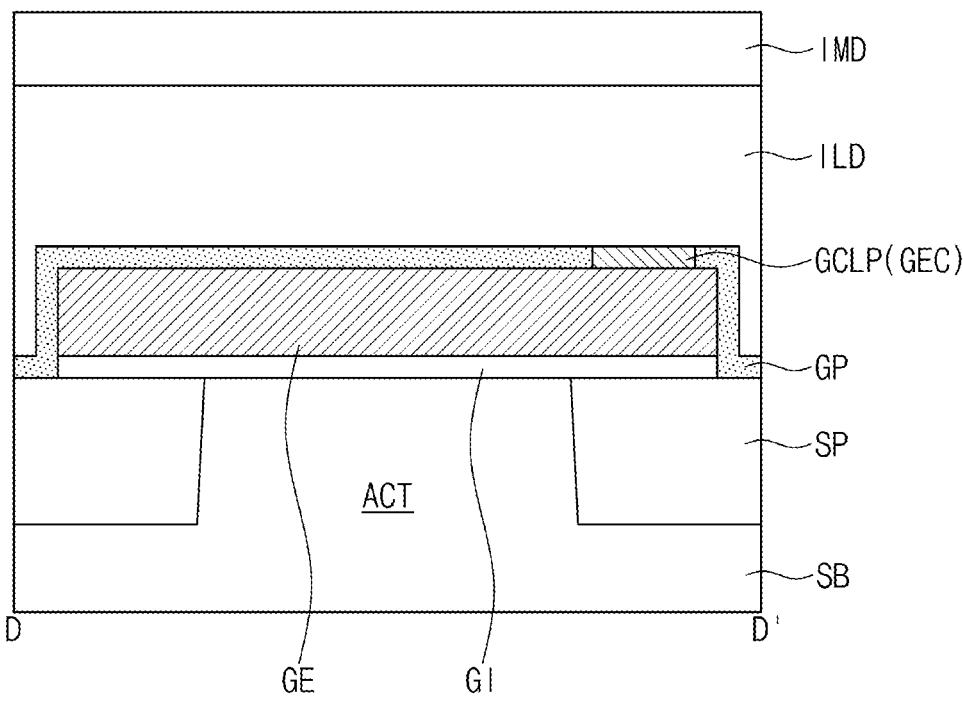
Figure 4:
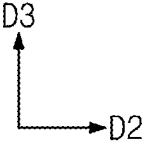

FIG. 1 is a plan view illustrating an image sensor according to some embodiments of the present inventive concepts. FIGS. 2 to 4 are cross-sectional views illustrating an image sensor according to some embodiments of the present inventive concepts. FIG. 2 corresponds to a cross-section taken along lines A-A' and B-B' of FIG. 1. FIG. 3 corresponds to a cross-section taken along line C-C' of FIG. 1. FIG. 4 corresponds to a cross-section taken along line D-D' of FIG. 1.

Referring to FIGS. 1 to 4, an image sensor may include at least a semiconductor device formed on a substrate SB. The semiconductor device may correspond to a portion of the image sensor. For example, the semiconductor device may correspond to at least one of a reset transistor, a source follower transistor, and a selection transistor that are included in the image sensor. Alternatively, the semiconductor device may correspond to a portion of one of a peripheral circuit region, a core region, and a logic region that are included in a memory apparatus. For example, the semiconductor device may be any of the transistors included in the memory apparatus.

The substrate SB may be provided. The substrate SB may be a semiconductor substrate. For example, the substrate SB may include a semiconductor material, such as silicon (Si). The substrate SB may be a monocrystalline silicon substrate, a silicon epitaxial layer, or a silicon-on-insulator (SOI) substrate, as examples. The substrate SB may be doped with impurities having a first conductivity type. The terms "first," "second," etc. may be used herein merely to distinguish one element, layer, conductivity type, etc., from another.

A device isolation part SP may be disposed in the substrate SB. The device isolation part SP may include at least one of a device isolation layer and a device isolation region. For example, the device isolation layer may be an area formed by performing a shallow trench isolation (STI) process on the substrate SB. For example, the device isolation layer may include at least one selected from a silicon oxide (SiO) layer, a silicon nitride (SiN) layer, and a silicon oxynitride (SiON) layer. The device isolation region may be an area doped with impurities having the first conductivity type in the substrate SB, as examples. In this case, a concentration of the impurities doped in the device isolation region may be greater than that in the substrate SB.

The substrate SB may be provided therein with an active region ACT defined by the device isolation part SP. The active region ACT may extend in a first direction D1. For example, the active region ACT may have a rectangular shape that extends in the first direction D1. In some embodiments, the first direction D1 and a second direction D2 may be defined to indicate directions that intersect each other and are parallel to a top surface of the substrate SB, and a third direction D3 may be defined to indicate a direction that is perpendicular to the top surface of the substrate SB.

A gate electrode GE may be disposed on the substrate SB. The gate electrode GE may extend in the second direction D2. The gate electrode GE may run in the second direction D2 across the active region ACT. A portion of the gate electrode GE may overlap a portion of the active region ACT. For example, when viewed in a plan view, the gate electrode GE and the active region ACT may intersect each other. In this disclosure, the gate electrode GE may have a central part CP that overlaps the active region ACT, and may have protruding parts PP that are disposed on opposite sides in the second direction D2 of the central part CP. The protruding parts PP may protrude from the active region ACT in the second direction D2 or in a direction reverse to (i.e., opposite to) the second direction D2. The gate electrode GE may include impurity-doped polysilicon. The present inventive concepts, however, are not limited thereto, and the gate electrode GE may include at least one of a metal layer such as a tungsten (W) layer and a metal nitride layer such as a titanium nitride (TiN) layer.

The active region ACT may have opposite ends that protrude from opposite sidewalls of the gate electrode GE in the first direction D1 and in a direction reverse to the first direction D1. In this case, the opposite ends of the active region ACT may extend beyond and be exposed on the opposite sidewalls of the gate electrode GE. The active region ACT may have impurity regions IM disposed in the opposite ends thereof. The impurity regions IM may be doped with impurities having a second conductivity type opposite to the first conductivity type. One of the impurity regions IM may be a source region, and the other of the impurity regions IM may be a drain region.

A gate dielectric layer GI may be interposed between the gate electrode GE and the substrate SB. The gate dielectric layer GI may separate the gate electrode GE from the active region ACT. The gate dielectric layer GI may be provided along a bottom surface of the gate electrode GE. The gate dielectric layer GI may include a dielectric material or a high-k dielectric material. For example, the gate dielectric layer GI may include at least one selected from a silicon oxide (SiO) layer, a silicon oxynitride (SiON) layer, a silicon nitride (SiN) layer, and a metal oxide (MO) layer. For example, the metal oxide layer may include at least one selected from an aluminum oxide ($Al_2O_3$) layer, a hafnium oxide ($HfO_2$) layer, a zirconium oxide ($ZrO_2$) layer, and a ruthenium oxide ($RuO_2$) layer.

A single transistor may be constituted by the gate electrode GE, the gate dielectric layer GI, and the impurity regions IM. When voltages are applied to the gate electrode GE and one of the impurity regions IM, electrons or holes may migrate toward the other of the impurity regions IM, with the result that a channel region CH may be formed.

A gate protection layer GP may be disposed on the substrate SB. On the substrate SB, the gate protection layer GP may cover the gate electrode GE. For example, the gate protection layer GP may conformally cover the gate electrode GE and the top surface of the substrate SB. The gate protection layer GP may include a dielectric material. The gate protection layer GP may include a different material from that of an interlayer dielectric layer ILD which will be discussed below. For example, the gate protection layer GP may include a silicon oxide (SiO) layer, a silicon nitride (SiN) layer, or a silicon oxynitride (SiON) layer.

An interlayer dielectric layer ILD may be provided on the substrate SB. On the gate protection layer GP, the interlayer dielectric layer ILD may cover the substrate SB and the gate electrode GE. The interlayer dielectric layer ILD may have a single-layered or a multi-layered structure including at least one selected from a silicon oxide (SiO) layer, a silicon nitride (SiN) layer, a silicon oxynitride (SiON) layer, and a porous dielectric layer.

The substrate SB may be provided with source/drain contacts SDC thereon. The source/drain contacts SDC may penetrate the interlayer dielectric layer ILD and the gate protection layer GP, and may contact a top surface of the active region ACT. The source/drain contacts SDC may be disposed on opposite sides of the gate electrode GE. For example, the source/drain contacts SDC may be disposed on opposite sides of the gate electrode GE, which opposite sides are spaced apart from each other in the first direction D1 and in a direction reverse to the first direction D1. The source/drain contacts SDC may be coupled to corresponding impurity regions IM of the active region ACT. The source/drain contacts SDC may include a metallic or metal material, such as tungsten (W) or copper (Cu).

A gate contact GEC may be provided on the substrate SB. The gate contact GEC may penetrate the interlayer dielectric layer ILD and the gate protection layer GP, and may contact a top surface of the gate electrode GE. The gate contact GEC may be disposed on one side of the active region ACT. For example, the gate contact GEC may be located on opposite sides of the active region ACT, which opposite sides are spaced apart from each other in the second direction D2 and in a direction reverse to the second direction D2. The gate contact GEC may be disposed on the protruding part PP of the gate electrode GE, that is, outside of the active region ACT. In this case, the gate electrode GE may be provided with the gate contact GEC on its one end that is adjacent in the second direction D2 or in a direction reverse to the second direction D2. Differently from that shown, the gate electrode GE may be provided thereon with the gate contact GEC above the active region ACT. For example, the gate contact GEC may be disposed on a central part CP of the gate electrode GE. Alternatively, on the gate electrode GE, the gate contact GEC may be disposed such that only a portion of the gate contact GEC may overlap the active region ACT. For example, the gate contact GEC may overlap all of the central part CP and the protruding part PP of the gate electrode GE. The gate contact GEC may include a metallic or metal material, such as tungsten (W) or copper (Cu). The gate contact GEC may have a lower part GCLP and an upper part GCUP on the lower part GCLP.

The lower part GCLP of the gate contact GEC may be in contact with (e.g., may extend directly on) the top surface of the gate electrode GE. As used herein, when an element or layer is referred to as being "directly" on or contacting another element or layer, no intervening elements or layers are present. For example, the lower part GCLP of the gate contact GEC may correspond to a bottom portion of the gate contact GEC, which bottom portion is directly on the gate electrode GE. The gate electrode GE may be provided with the lower part GCLP of the gate contact GEC on its one end that is adjacent in the second direction D2 or in a direction reverse to the second direction D2. The gate protection layer GP may surround the lower part GCLP of the gate contact GEC. The lower part GCLP of the gate contact GEC may be exposed on a top surface of the gate protection layer GP. The lower part GCLP of the gate contact GEC may have a top surface that is coplanar with that of the gate protection layer GP. For example, the lower part GCLP of the gate contact GEC may have the same thickness as that of the gate protection layer GP. The lower part GCLP of the gate contact GEC may have a planar shape, e.g., a bar shape. For example, the lower part GCLP of the gate contact GEC may have a bar shape that extends in the first (e.g., horizontal) direction D1, and may also be referred to as a horizontal part. The lower part GCLP of the gate contact GEC may cover a top surface of the protruding part PP of the gate electrode GE. In this case, the lower part GCLP of the gate contact GEC may have a planar shape (e.g., when viewed in plan view) that depends on that of the protruding part PP of the gate electrode GE. Based on a protruding distance of the protruding part PP of the gate electrode GE from the active region ACT, the protruding part PP of the gate electrode GE may have a linear shape that extends in the first direction D1, and the lower part GCLP of the gate contact GEC may also have a linear shape that extends in the first direction D1. For example, the lower part GCLP of the gate contact GEC may have a shape that extends along a lateral surface of the gate electrode GE, which lateral surface is directed in the second direction D2.

Figure 5:
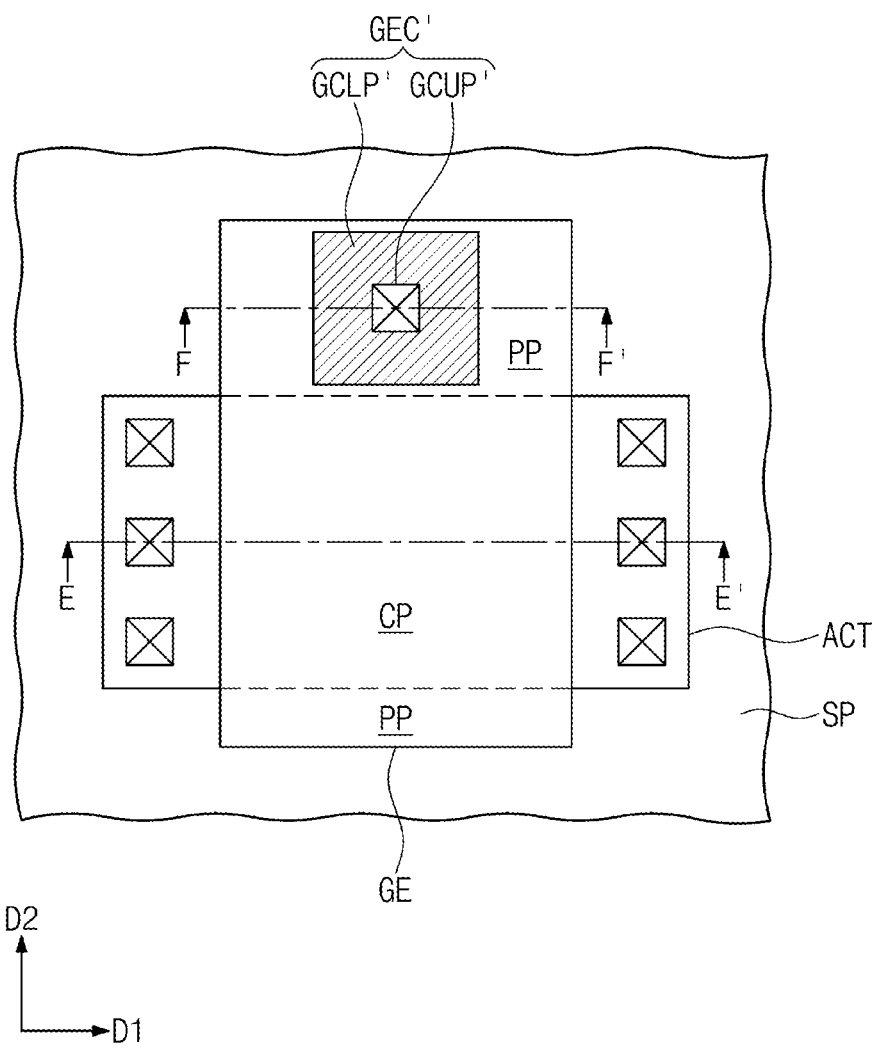
FIG. 5 is a plan view illustrating an image sensor according to some embodiments of the present inventive concepts.
Figure 6:
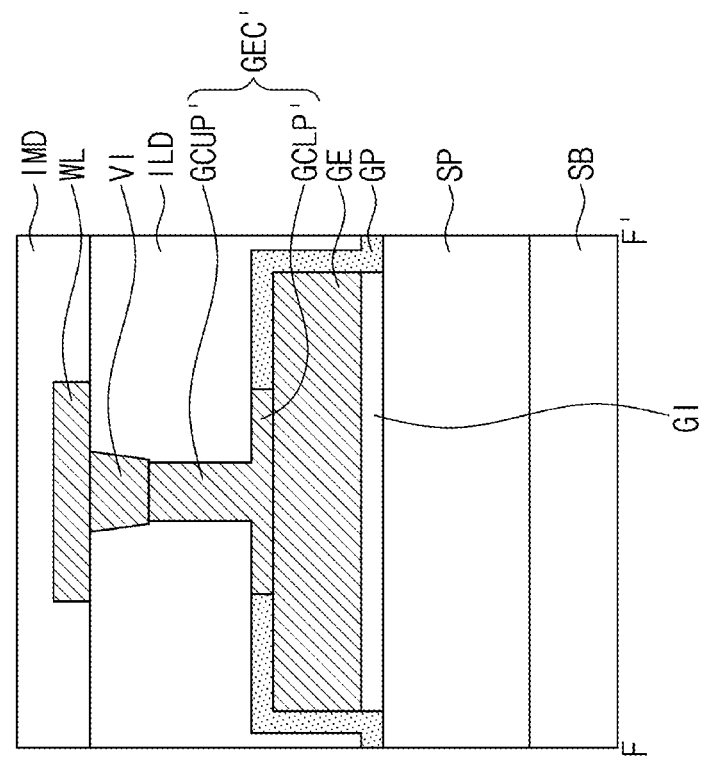
FIG. 6 is a cross-sectional view illustrating an image sensor according to some embodiments of the present inventive concepts.
Figure 6:
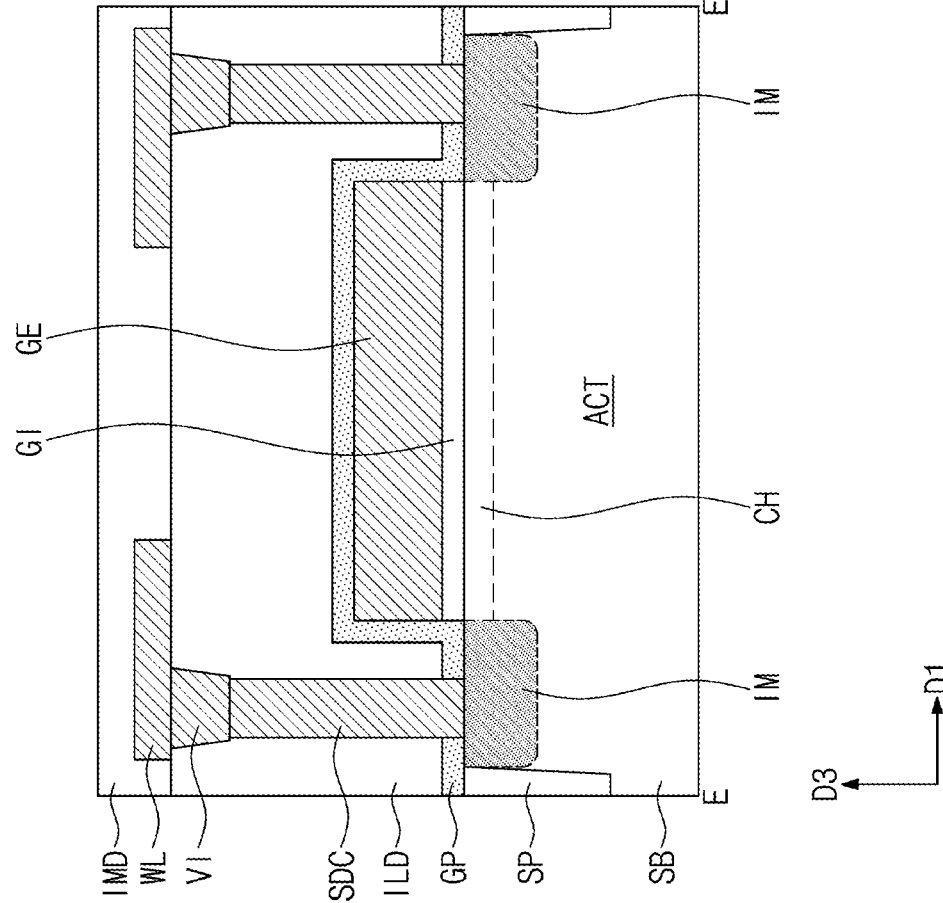
Figure 15:
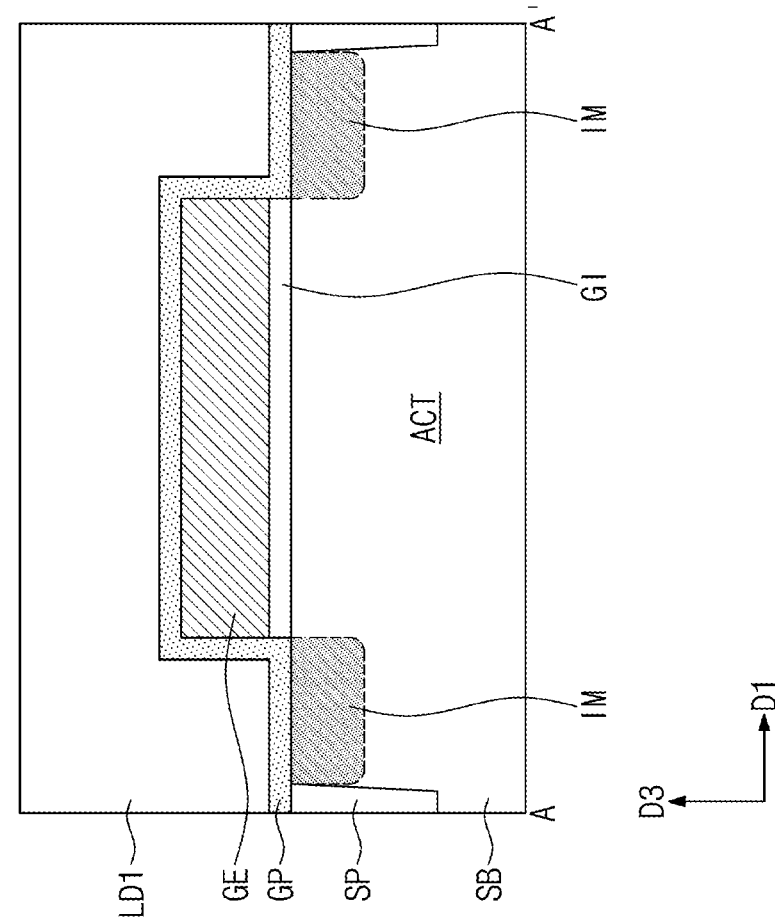

Although FIG. 1 depicts that the lower part GCLP of the gate contact GEC has a bar shape, the present inventive concepts are not limited thereto. FIG. 5 is a plan view illustrating an image sensor according to some embodiments of the present inventive concepts. FIG. 6 is a cross-sectional view taken along lines E-E' and F-F' of FIG. 15, illustrating an image sensor according to some embodiments of the present inventive concepts. According to some embodiments, as shown in FIGS. 5 and 6, a gate contact GEC' may have a planar shape, e.g., a plate shape, at a lower part GCLP' thereof. For example, the lower part GCLP' of the gate contact GEC' may have a planar tetragonal shape, such as a square or a rectangle. In this case, the protruding part PP of the gate electrode GE may have a large distance from or may extend substantially beyond the active region ACT. The protruding part PP of the gate electrode GE may have a large area at the top surface thereof. Therefore, the gate contact GEC' may be more easily formed to have various planar shapes at the lower part GCLP' thereof. For example, when the lower part GCLP' of the gate contact GEC' is formed, the lower portion GCLP' may be easier to form in a linear shape than a rectangular shape or a circular shape whose area is the same as that of the linear shape, with the result that it may be easier to form the following-described upper portion GCUP' of the gate contact GEC'. This will be discussed below in detail together with the formation of an image sensor.

Differently from that shown, the lower part GCLP of the gate contact GEC may have a planar shape, such as an L shape, a circular shape, or any other suitable shape. The lower part GCLP of the gate contact GEC may have a planar shape that depends on that of the protruding part PP of the gate electrode GE. The following description will focus on the example of FIGS. 1 to 4.

The gate contact GEC may include an upper part GCUP provided on the lower part GCLP of the gate contact GEC. For example, the upper part GCUP of the gate contact GEC may correspond to a vertical portion that provides vertical connection between wiring lines WL which will be discussed below. The upper part GCUP of the gate contact GEC may be in contact with the top surface of the lower part GCLP of the gate contact GEC. The upper part GCUP of the gate contact GEC may have a pillar shape that extends in the third (e.g., vertical) direction D3 from the top surface of the lower part GCLP of the gate contact GEC, and may also be referred to as a vertical part. For example, the upper part GCUP of the gate contact GEC may penetrate the interlayer dielectric layer ILD and may be coupled to the lower part GCLP of the gate contact GEC. The upper part GCUP of the gate contact GEC may have a planar shape smaller than that of the lower part GCLP of the gate contact GEC. For example, the upper part GCUP of the gate contact GEC may have a width less than that of the lower part GCLP of the gate contact GEC. For example, when viewed in a plan view, the upper part GCUP of the gate contact GEC may have a first area less than a second area of the lower part GCLP of the gate contact GEC. The second area at the lower part GCLP of the gate contact GEC may be about 1.5 times to about 10 times the first area at the upper part GCUP of the gate contact GEC. The upper and lower parts GCUP and GCLP of the gate contact GEC may constitute a single or unitary body formed of the same material. For example, the upper and lower parts GCUP and GCLP of the gate contact GEC may be integral portions of the gate contact GEC that are formed of the same material. That is, in some embodiments, no interface may be present between the upper and lower parts GCUP and GCLP of the gate contact GEC.

Wiring lines WL may be disposed on the interlayer dielectric layer ILD. The wiring lines WL may be electrically connected to the source/drain contacts SDC and the gate contact GEC. The wiring lines WL may redistribute the source/drain contacts SDC and the gate contact GEC. The wiring lines WL may include a metallic or metal material, such as copper (Cu). Although not shown, the wiring line WL may include a source layer and a barrier layer that are provided on a bottom surface thereof or on bottom and lateral surfaces thereof. The source layer may include metal, such as gold (Au). The barrier layer may include conductive metal nitride, such as titanium nitride (TiN) or tantalum nitride (TaN).

The wiring lines WL may be connected to the source/drain contacts SDC and the gate contact GEC through vias VI provided on the bottom surfaces of the wiring lines WL. The vias VI may extend from the bottom surfaces of the wiring lines WL into the interlayer dielectric layer ILD, and may contact top surfaces of the source/drain contacts SDC and a top surface of the gate contact GEC. The vias VI may each have a width that decreases with increasing distance from a top surface of the interlayer dielectric layer ILD. The vias VI may include metal, such as copper (Cu). The source layer and the barrier layer may be provided either between the wiring line WL and the via VI or along the bottom surface of the via VI. The vias VI may not be provided in some embodiments. In this case, the source/drain contacts SDC and the gate contact GEC may be exposed at or on a top surface of the interlayer dielectric layer ILD.

An intermetal dielectric layer IMD may be provided on the interlayer dielectric layer ILD. The intermetal dielectric layer IMD may cover the wiring lines WL. The intermetal dielectric layer IMD may have a single-layered or a multi-layered structure including at least one selected from a silicon oxide (SiO) layer, a silicon nitride (SiN) layer, a silicon oxynitride (SiON) layer, and a porous dielectric layer.

Although not shown, the intermetal dielectric layer IMD may be provided thereon with a plurality of lines, a plurality of intermetal dielectric layers, or a passivation layer.

According to some embodiments of the present inventive concepts, the gate contact GEC may have a larger area at the lower part GCLP in contact with the gate electrode GE than at the upper part GCUP. Therefore, the gate electrode GE and the lower part GCLP of the gate contact GEC may have therebetween a larger contact area and a smaller or reduced contact resistance. Accordingly, the image sensor may increase or improve in electrical properties. In addition, the gate contact GEC may have a smaller area at the upper part GCUP in contact with the wiring line WL than at the lower part GCLP. Therefore, a smaller planar area (e.g., when viewed in plan view) may be occupied by the upper part GCUP of the gate contact GEC than the lower part GCLP, and smaller line-widths and narrower intervals may be provided for the wiring lines WL and the vias VI connected to the upper part GCUP of the gate contact GEC. Accordingly, the wiring lines WL may increase in integration, and the image sensor may decrease in size.

Figure 7:
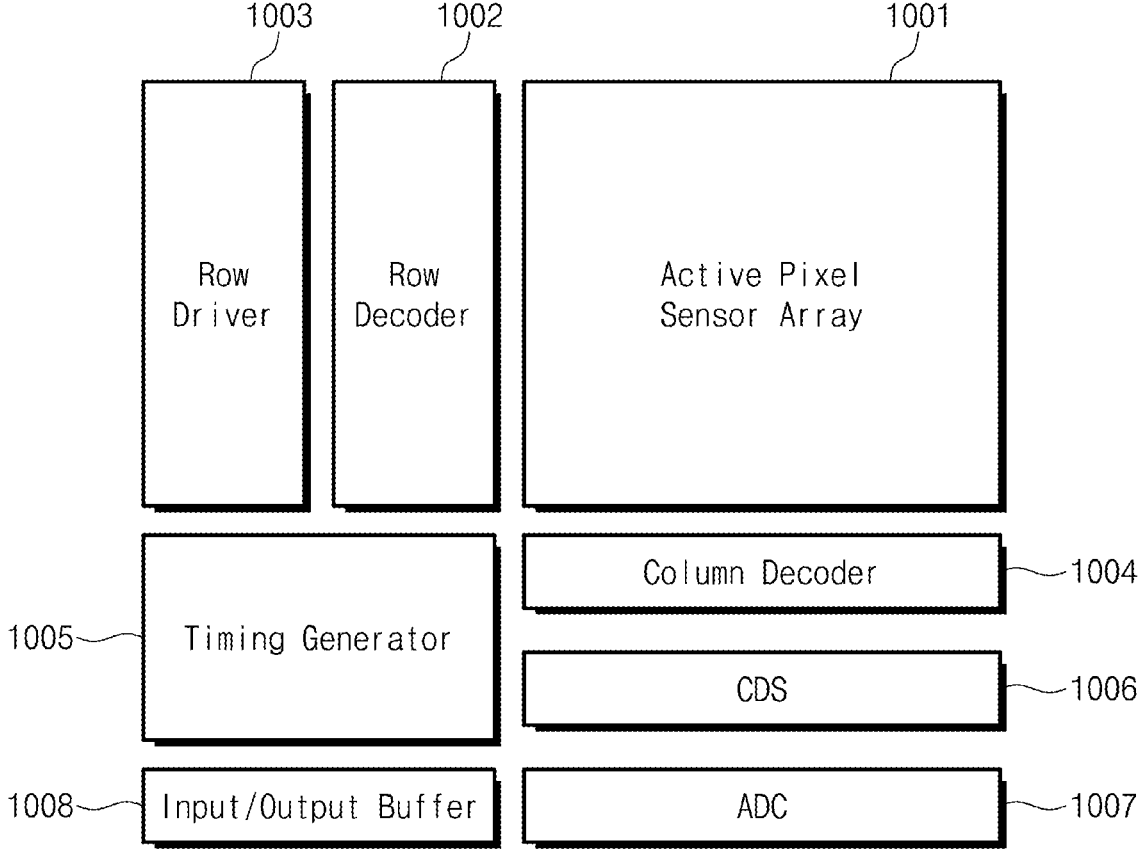
FIG. 7 is a block diagram illustrating an image sensor according to some embodiments of the present inventive concepts.

FIG. 7 is a block diagram illustrating an image sensor according to some embodiments of the present inventive concepts.

Referring to FIG. 7, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output buffer 1008.

The active pixel sensor array 1001 may have unit pixels that are two-dimensionally arranged. The active pixel sensor array 1001 may convert optical signals into electrical signals. The active pixel sensor array 1001 may be driven by a plurality of driving signals such as a pixel selection signal, a reset signal, and a charge transfer signal from the row driver 1003. The correlated double sampler 1006 may be provided with the electrical signals that are converted by the active pixel sensor array 1001.

The row driver 1003 may provide the active pixel sensor array 1001 with several driving signals for driving several unit pixels in accordance with a decoded result obtained from the row decoder 1002. When the unit pixels are arranged in a matrix shape, the row driver 1003 may provide each row with driving signals.

The timing generator 1005 may provide timing and control signals to the row decoder 1002 and the column decoder 1004.

The correlated double sampler 1006 may receive the electrical signals generated from the active pixel sensor array 1001, and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter 1007 may convert analog signals, which correspond to the difference level received from the correlated double sampler 1006, into digital signals, and then may output the converted digital signals.

The input/output buffer 1008 may latch the digital signals and then sequentially output the latched digital signals to an image signal processing unit (not shown) in response to the decoded result obtained from the column decoder 1004.

Figure 8:
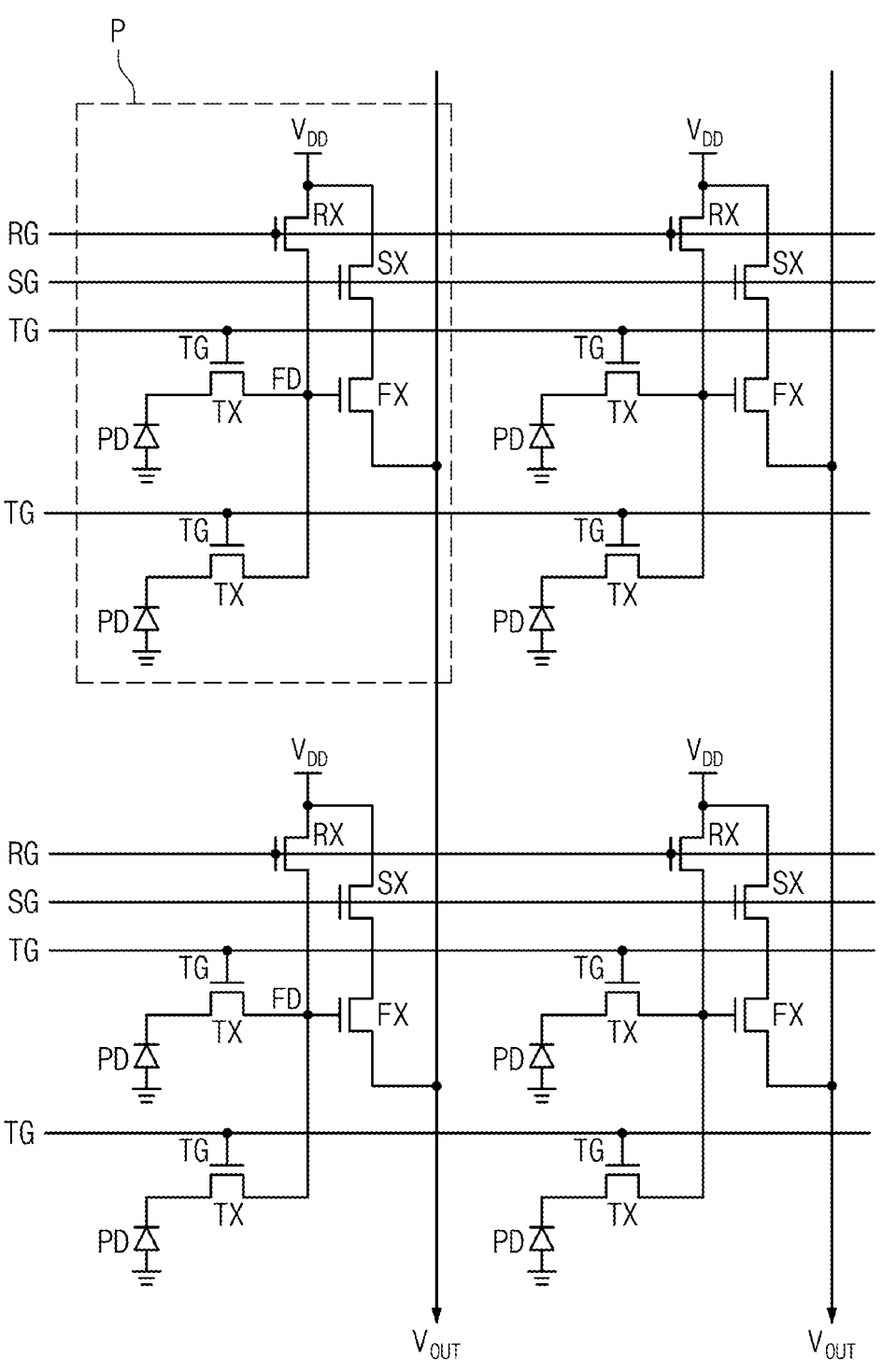
FIG. 8 is a circuit diagram illustrating an active pixel sensor array of an image sensor according to some embodiments of the present inventive concepts.

FIG. 8 is a circuit diagram illustrating an active pixel sensor array of an image sensor according to some embodiments of the present inventive concepts.

Referring to FIG. 8, the active pixel sensor array 1001 discussed with reference to FIG. 7 may include a plurality of unit pixel groups P, which unit pixel groups P may be arranged in a matrix shape. Each of the unit pixel groups P may include transfer transistors TX and logic transistors RX, SX, and FX. The logic transistors RX, SX and FX may include a reset transistor RX, a selection transistor SX, and a source follower transistor FX.

The transfer transistors TX may each include a transfer gate electrode TG and a photoelectric conversion element PD. The transfer transistors TX may share a charge detection node FD, or a floating diffusion region. Although FIG. 8 depicts that two transfer transistors TX are provided in one unit pixel group P, the number of the transfer transistors TX in one unit pixel group P is not limited to two, but may be variously changed if needed.

The photoelectric conversion elements PD may create and accumulate photo-charges in proportion to the amount of externally incident light. The photoelectric conversion element PD may be one of a photo diode, a photo transistor, a photo gate, a pinned photo diode (PPD), and a combination thereof.

Transfer gate electrodes TG may provide the charge detection node FD with charged accumulated in the photoelectric conversion elements PD. The transfer gate electrodes TG may be supplied with complimentary signals. For example, charges may be transferred to the charge detection node FD from one of the photoelectric conversion elements PD.

The charge detection node FD may receive and accumulate charged generated from the photoelectric conversion elements PD. The source follower transistor FX may be controlled by the amount of photo-charges accumulated in the charge detection node FD.

The reset transistor RX may periodically reset the charges accumulated in the charge detection node FD. For example, the reset transistor RX may have a drain region connected to the charge detection node FD and a source region connected to power voltage VDD. When the reset transistor RX is turned on, the charge detection node FD may receive the power voltage VDD connected to the source region of the reset transistor RX. Accordingly, when the reset transistor RX is turned on, the charges accumulated in the charge detection node FD may be exhausted and thus the charge detection node FD may be reset.

The source follower transistor FX and a constant current source (not shown) positioned outside the unit pixel group P may be combined with each other to serve as a source follower buffer amplifier. A source potential of the source follower transistor FX may be changed in proportion to the amount of charges accumulated in the charge detection node FD. The source follower transistor FX may amplify a variation in electrical potential of the charge detection node FD and may output the amplified electrical potential to an output line VOUT.

The selection transistor SX may select each row of the unit pixel groups P to be readout. When the selection transistor SX is turned on, a drain region of the selection transistor SX may receive the power voltage VDD connected to a drain region of the source follower transistor FX.

Figure 9:
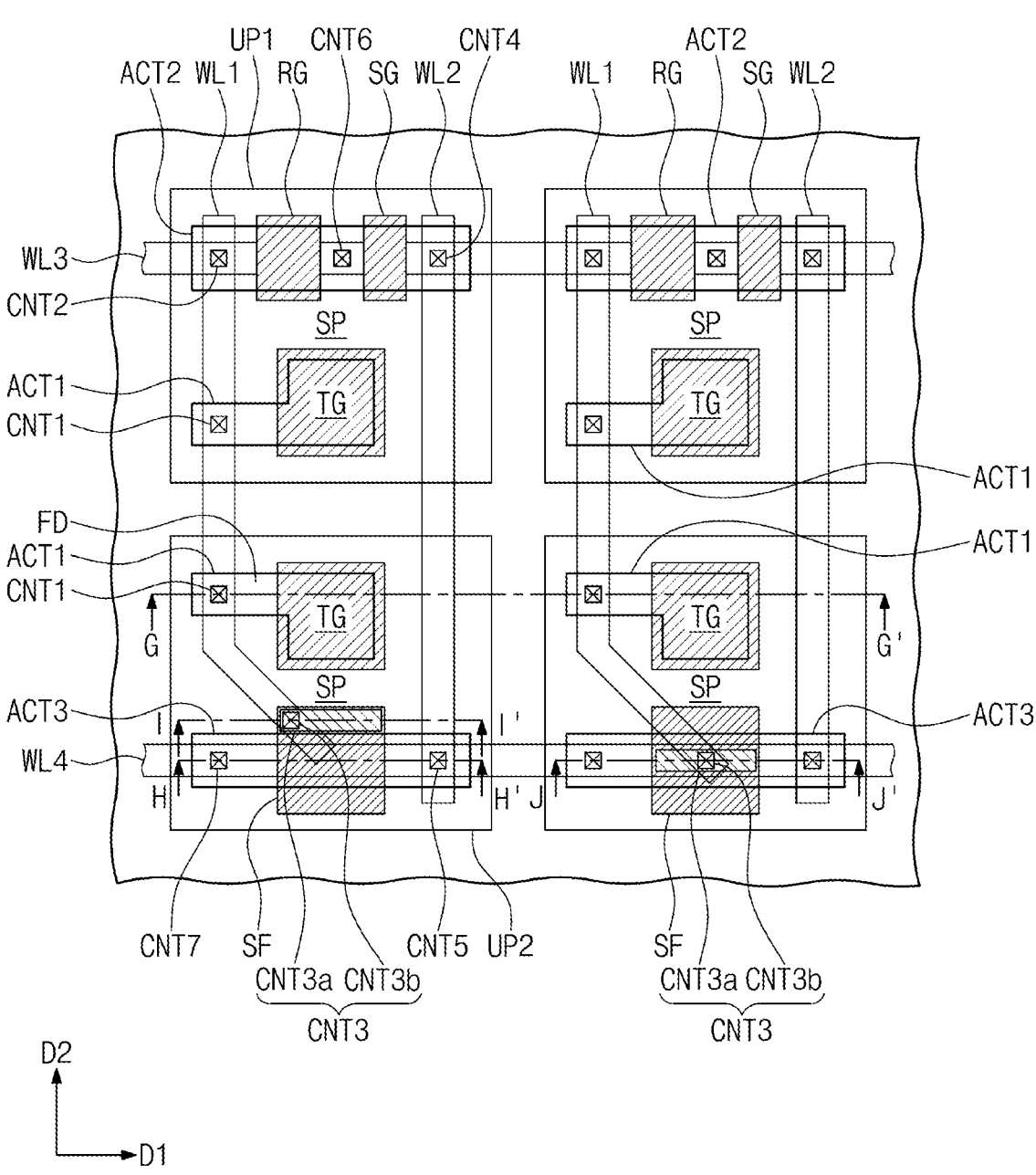
FIG. 9 is a plan view illustrating an image sensor according to some embodiments of the present inventive concepts.
Figure 10:
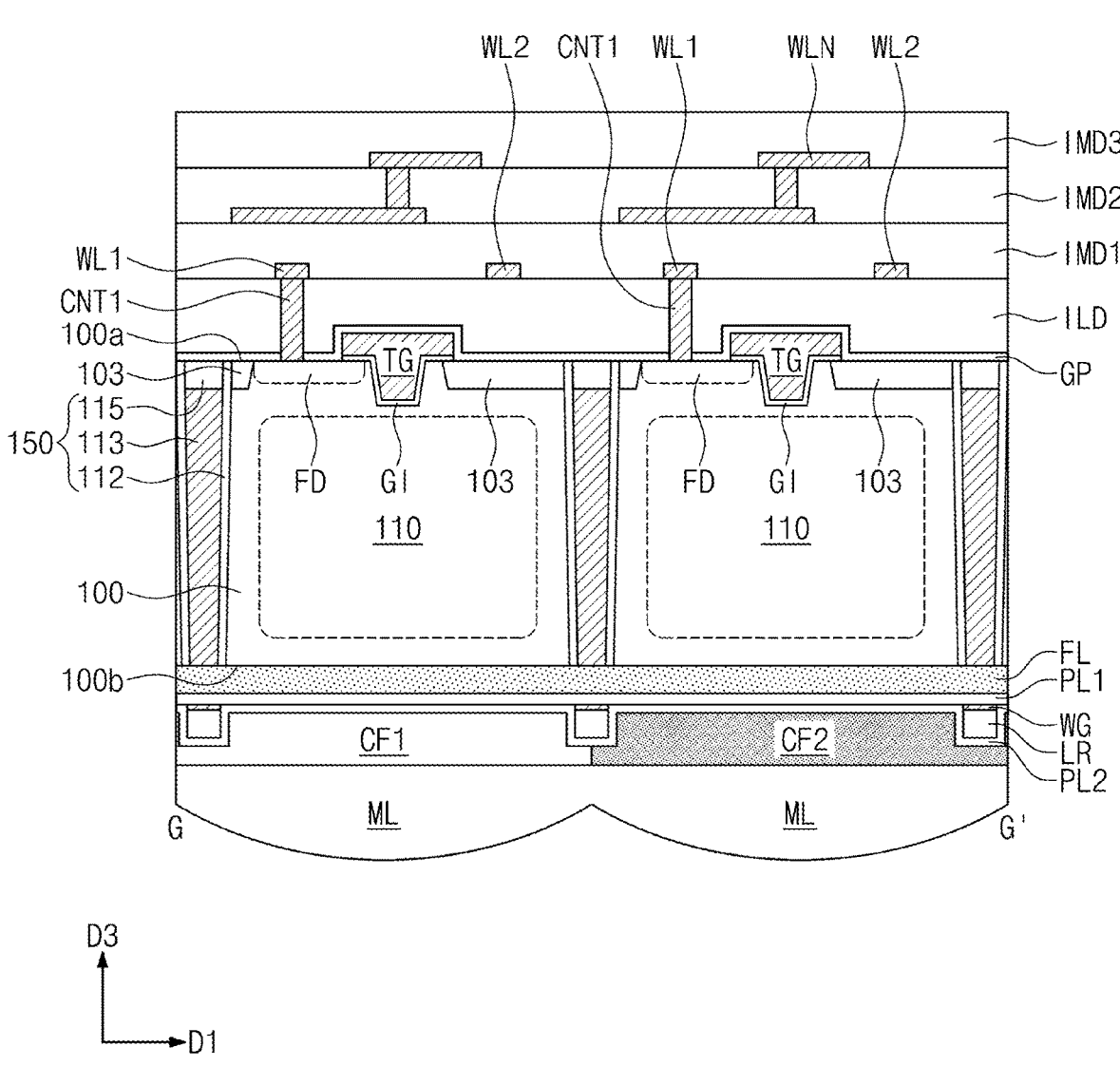
FIGS. 10, 11, and 12 are cross-sectional views illustrating an image sensor according to some embodiments of the present inventive concepts.
Figure 11:
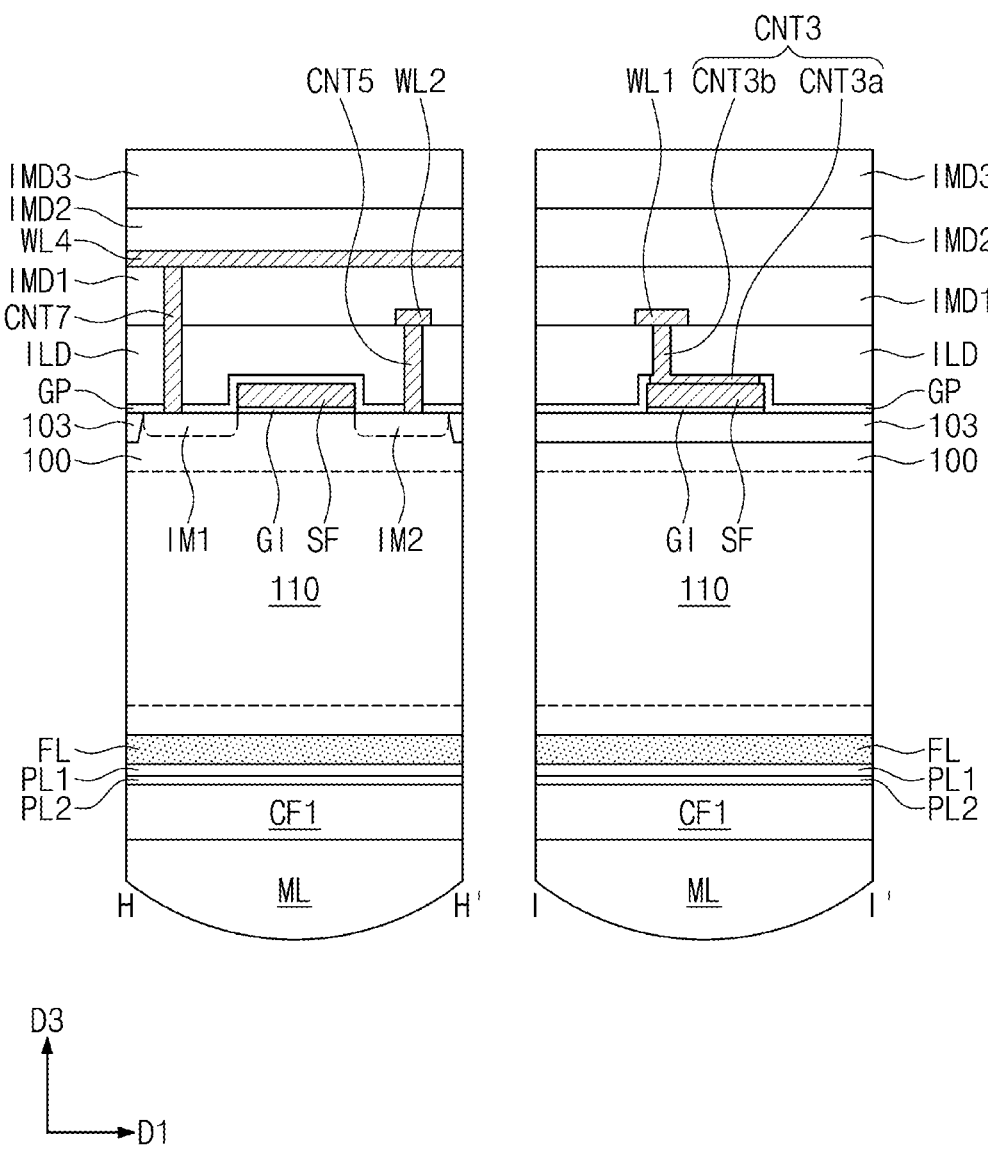
Figure 12:
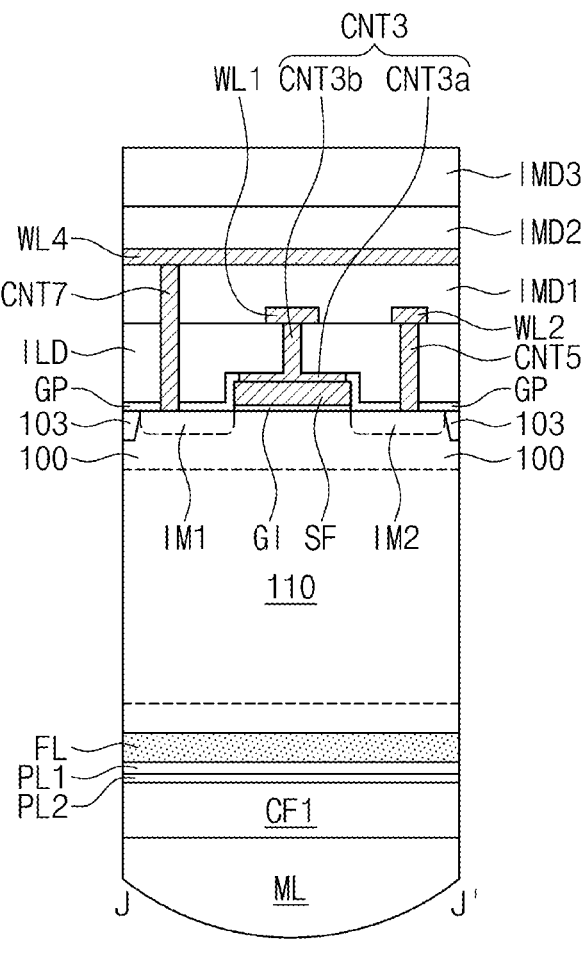
Figure 12:
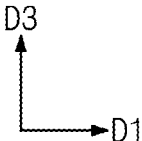

FIG. 9 is a plan view illustrating an image sensor according to some embodiments of the present inventive concepts. FIGS. 10 to 12 are cross-sectional views illustrating an image sensor according to some embodiments of the present inventive concepts. FIG. 10 corresponds to a cross-section taken along line G-G' of FIG. 9. FIG. 11 corresponds to a cross-section taken along lines H-H' and I-I' of FIG. 9. FIG. 12 corresponds to a cross-section taken along line J-J' of FIG. 9.

Referring to FIGS. 9 to 11, a substrate 100 may be provided. The substrate 100 may be a monocrystalline silicon substrate, a silicon epitaxial layer, or a silicon-on-insulator (SOI) substrate. The substrate 100 may be doped with impurities having a first conductivity type. For example, the first conductivity type may be p-type. The substrate 100 may include a plurality of unit pixels, first unit pixels UP1 and second unit pixels UP2, as examples. One of the first unit pixels UP1 and its adjacent one of the second unit pixels UP2 may constitute one unit pixel group (see P of FIG. 8) discussed with reference to FIG. 8.

In the substrate 100, photoelectric conversion regions 110 may be correspondingly disposed in the first and second unit pixels UP1 and UP2. The photoelectric conversion regions 110 may be doped with impurities having a second conductivity type opposite to the first conductivity type. For example, the second conductivity type may be n-type. The n-type impurity doped in the photoelectric conversion region 110 and the p-type impurity doped around the substrate 100 may constitute a PN junction, thereby providing a photodiode.

The substrate 100 may be provided therein with a device isolation part 103 adjacent to a first surface 100a of the substrate 100. The device isolation part 103 may correspond to the device isolation part SP discussed with reference to FIGS. 1 to 6. The device isolation part 103 may define active regions ACT1, ACT2, and ACT3 on the first and second unit pixels UP1 and UP2. For example, the device isolation part 103 may define a first active region ACT1 and a second region ACT2 on the first unit pixel UP1, and may define a first active region ACT1 and a third active region ACT3 on the second unit pixel UP2.

Transfer transistors (see TX of FIG. 8) may be disposed on the first active regions ACT1. For example, on the first unit pixel UP1 and the second unit pixel UP2, transfer gate electrodes TG may be disposed on corresponding first active regions ACT1. The first active regions ACT1 may be provided therein with floating diffusion regions FD on sides of the transfer gate electrodes TG.

The transfer gate electrodes TG may each be a vertical type in which a portion of the transfer gate electrode TG is inserted or extends into the substrate 100. Alternatively, the transfer gate electrodes TG may each be a planar type in which the transfer gate electrode TG has a flat bottom surface without extending into the substrate 100. A gate dielectric layer GI may be interposed between the substrate 100 and each of the transfer gate electrodes TG. The floating diffusion region FD may be doped with impurities having the second conductivity type opposite to the first conductivity type.

The second active region ACT2 may be provided thereon with a reset transistor (see RX of FIG. 9) and a selection transistor (see SX of FIG. 8). For example, a reset gate electrode RG and a selection gate electrode SG may cross over the second active region ACT2. The second active region ACT2 may be provided therein with impurity regions on a side of the reset gate electrode RG and a side of the selection gate electrode SG. The impurity regions may be doped with impurities having the second conductivity type opposite to the first conductivity type. In the substrate 100, the photoelectric conversion region 110 may extend below the impurity regions, and may be spaced apart from the impurity regions.

A source follower transistor (see FX of FIG. 8) may be disposed on the third active region ACT3. A source follower gate electrode SF may cross over the third active region ACT3. The third active region ACT3 may be provided therein with first and second impurity regions IM1 and IM2 on opposite sides of the source follower gate electrode SF. The first and second impurity regions IM1 and IM2 may be doped with impurities having the second conductivity type opposite to the first conductivity type. In the substrate 100, the photoelectric conversion region 110 may extend below the first and second impurity regions IM1 and IM2, and may be spaced apart from the first and second impurity regions IM1 and IM2.

A pixel separation part 150 may be provided in the substrate 100. The pixel separation part 150 may divide and limit the first and second unit pixels UP1 and UP2 from each other in the substrate 100. The pixel separation part 150 may have a mesh shape when viewed in a plan view. The pixel separation part 150 may vertically penetrate the device isolation part 103. The pixel separation part 150 may include a conductive pattern 113 disposed in the substrate 100, a first dielectric pattern 112 interposed between the conductive pattern 113 and the substrate 100, and a second dielectric pattern 115 on the conductive pattern 113. The conductive pattern 113 may have a mesh shape when viewed in a plan view. The conductive pattern 113 may contain metal or impurity-doped polysilicon. The first dielectric pattern 112 and the second dielectric pattern 115 may include a silicon oxide (SiO) layer.

According to some embodiments of the present inventive concepts, the image sensor may be a back-lit image sensor or a backside illuminated image sensor. The substrate 100 may receive external light through a second surface 100b of the substrate 100 opposite to the first surface 100a of the substrate 100. The received light may generate electron-hole from PN junctions constituted by the photoelectric conversion regions 110. The generated electrons may migrate toward the photoelectric conversion region 110. When voltage is applied to the transfer gate electrode TG, the electrons may migrate toward the floating diffusion region FD.

A gate protection layer GP may be disposed on the substrate 100. The substrate 100 may be provided on its first surface 100a with the gate protection layer GP that covers the transfer transistors TX, the reset transistor RX, the selection transistor (see SX of FIG. 8), and the source follower transistor FX. For example, the gate protection layer GP may conformally cover the first surface 100a of the substrate 100, the transfer gate electrodes TG, the reset gate electrode RG, and the source/follower gate electrode SF. The gate protection layer GP may include a dielectric material. The gate protection layer GP may include a different material from that of an interlayer dielectric layer ILD which will be discussed below. For example, the gate protection layer GP may include a silicon oxide (SiO) layer, a silicon nitride (SiN) layer, or a silicon oxynitride (SiON) layer.

An interlayer dielectric layer ILD may be provided on the substrate 100. The gate protection layer GP may be provided thereon with the interlayer dielectric layer ILD that covers the transfer transistors TX, the reset transistor RX, and the source/follower transistor FX. The interlayer dielectric layer ILD may have a single-layered or a multi-layered structure including at least one selected from a silicon oxide (SiO) layer, a silicon nitride (SiN) layer, a silicon oxynitride (SiON) layer, and a porous dielectric layer.

The interlayer dielectric layer ILD may be provided thereon with intermetal dielectric layers IMD1, IMD2, and IMD3. The intermetal dielectric layers IMD1, IMD2, and IMD3 may have a single-layered or a multi-layered structure including at least one selected from a silicon oxide (SiO) layer, a silicon nitride (SiN) layer, a silicon oxynitride (SiON) layer, and a porous dielectric layer. The intermetal dielectric layers IMD1, IMD2, and IMD3 may be provided therebetween with wiring lines WL1, WL2, WL2, and WLN and contact plugs CNT1, CNT2, CNT3, CNT4, CNT5, CNT6, and CNT7. The contact plugs CNT1, CNT2, CNT3, CNT4, CNT5, CNT6, and CNT7 may include metal, such as tungsten (W) or copper (Cu).

A first wiring line WL1 may be electrically connected through a first contact plug CNT1 to the floating diffusion region FD of the transfer transistors (see TX of FIG. 8). The first wiring line WL1 may be electrically connected through a second contact plug CNT2 to the impurity region on a side of the reset gate electrode RG. In addition, the first wiring line WL1 may be electrically connected through a third contact plug CNT3 to the source follower gate electrode SF. The third contact plug CNT3 may be disposed on one side of the third active region ACTS. The third contact plug CNT3 may correspond to the gate contact (see GEC of FIGS. 1 to 6) discussed with reference to FIGS. 1 to 6. For example, the third contact plug CNT3 may have a lower part CNT3a and an upper part CNT3b on the lower part CNT3a.

The lower part CNT3a may be in contact with a top surface of the source follower gate electrode SF. The gate protection layer GP may surround the lower part CNT3a of the third contact plug CNT3. The lower part CNT3a of the third contact plug CNT3 may be exposed on a top surface of the gate protection layer GP. The lower part CNT3a of the third contact plug CNT3 may have a top surface that is coplanar with that of the gate protection layer GP. For example, the lower part CNT3a of the third contact plug CNT3 may have the same thickness as that of the gate protection layer GP. The lower part CNT3a of the third contact plug CNT3 may have a plate or bar shape that extends in one direction. Alternatively, the lower part CNT3a of the third contact plug CNT3 may have an L shape, a circular shape, or any other planar shape, i.e., in plan view.

The upper part CNT3b of the third contact plug CNT3 may be provided on the lower part CNT3a of the third contact plug CNT3. The upper part CNT3b of the third contact plug CNT3 may have a pillar shape that extends toward the first wiring line WL1 from the top surface of the lower part CNT3a of the third contact plug CNT3. For example, the upper part CNT3b of the third contact plug CNT3 may penetrate the interlayer dielectric layer ILD and have connection with the lower part CNT3a of the third contact plug CNT3. The upper part CNT3b of the third contact plug CNT3 may have a planar shape smaller than that of the lower part CNT3a of the third contact plug CNT3. For example, the upper part CNT3b of the third contact plug CNT3 may have an area (e.g., a plan view area) that is less than that of the lower part CNT3a of the third contact plug CNT3. The lower and upper parts CNT3a and CNT3b of the third contact plug CNT3 may constitute a single or unitary body formed of the same material.

According to some embodiments of the present inventive concepts, the third contact plug CNT3 may have a larger contact area at the lower part CNT3a in contact with the source follower gate electrode SF than at the upper part CNT3b in contact with a wiring line WL1. Therefore, the source follower gate electrode SF and the lower part CNT3a of the third contact plug CNT3 may have therebetween a larger contact area and a smaller contact resistance than the upper part CNT3b. Accordingly, the image sensor may increase in electrical properties.

In addition, the intermetal dielectric layers IMD1, IMD2, and IMD3 may be provided therein with a plurality of wiring lines WL1, WL2, WL3, and WLN and a plurality of contact plugs CNT1, CNT2, CNT3, CNT4, CNT5, CNT6, and CNT7 for electrical connection with the transfer transistors (see TX of FIG. 8), the reset transistor (see RX of FIG. 80, the selection transistor (see SX of FIG. 8), and the source follower transistor (see FX of FIG. 8). According to some embodiments of the present inventive concepts, the third contact plug CNT3 may have a smaller area at the upper part CNT3b in contact with one of the wiring lines WL1, WL2, WL3, and WLN than at the lower part CNT3a in contact with the source follower gate electrode SF. Therefore, the upper part CNT3b of the third contact plug CNT3 may occupy a small planar area than the lower part CNT3a, and smaller line-widths and narrower intervals may be provided for the wiring lines WL1, WL2, WL3, and WLN that are electrically connected to the contact plugs CNT1, CNT2, CNT3, CNT4, CNT5, CNT6, and CNT7. Accordingly, the wiring lines WL1, WL2, WL3, and WLN may increase in integration, and the image sensor may decrease in size.

Differently from that shown, the third contact plug CNT3 may be disposed on the third active region ACT3. As illustrated in FIG. 12, the third active region ACT3 may be provided thereon with the third contact plug CNT3 disposed on the source follower gate electrode SF. The third contact plug CNT3 may be freely disposed, if necessary, on the source follower gate electrode SF. For example, the displacement of the third contact plug CNT3 may depend on arrangement and intervals of the wiring lines WL1, WL2, WL3, and WLN and the contact plugs CNT1, CNT2, CNT3, CNT4, CNT5, CNT6, and CNT7. The following description will focus on the embodiment of FIG. 11.

A second wiring line WL2 may be electrically connected through a fourth contact plug CNT4 to the impurity region on a side of the selection gate electrode SG. The second wiring line WL2 may be electrically connected through a fifth contact plug CNT5 to the second impurity region IM2 on a side of the source follower gate electrode SF.

A third wiring line WL3 may be electrically connected through a sixth contact plug CNT6 to the impurity region between the reset gate electrode RG and the selection gate electrode SG.

A fourth wiring line WL4 may be electrically connected through a seventh contact plug CNT7 to the first impurity region IM1 on a side of the source follower gate electrode SF.

The third wiring line WL3 and the fourth wiring line WL4 may each extend in the first direction D1.

A fixed charge layer FL may be provided on the second surface 100b of the substrate 100. The fixed charge layer FL may be in contact with the second surface 100b of the substrate 100. The fixed charge layer FL may be formed of a single-layered or multi-layered metal oxide layer including oxygen whose amount is less than its stoichiometric ratio, or a single-layered or multi-layered metal fluoride layer including fluorine whose amount is less than its stoichiometric ratio. Therefore, the fixed charge layer FL may have a negative fixed charge. The fixed charge layer FL may be formed of a single layer or multiple layers including metal oxide or metal fluoride. For example, the metal oxide or the metal fluoride may include at least one metal selected from hafnium (Hf), zirconium (Zr), aluminum (Al), tantalum (Ta), titanium (Ti), yttrium (Y), and lanthanides. For example, the fixed charge layer FL may include a hafnium oxide (Hf$_2$O$_3$) layer or an aluminum oxide (Al$_2$O$_3$) layer. The fixed charge layer FL may suppress or reduce dark current and white spot.

A first protection layer PL1 may be disposed on the fixed charge layer FL. The first protection layer PL1 may include at least one selected from a metal oxide layer, a plasma-enhanced tetraethylorthosilicate (PETEOS) layer, a silicon oxycarbide (SiOC) layer, a silicon oxide (SiO) layer, and a silicon nitride (SiN) layer.

A light-shield grid pattern WG may be disposed on the first protection layer PL1. The light-shield grid pattern WG may have a grid shape. The light-shield grid pattern WG may include tungsten (W) or titanium (Ti). The light-shield grid pattern WG may overlap the pixel separation part 150.

A low-refractive pattern LRI may be disposed in the light-shield grid pattern WG. When viewed in a plan view, the low-refractive pattern LR may overlap the light-shield grid pattern WG, and may have the same shape as that of the light-shield grid pattern WG. The low-refractive pattern LR may have a sidewall aligned with that of the light-shield grid pattern WG. The low-refractive pattern LR may include an organic material. The low-refractive pattern LR may have a refractive index less than those of color filters CF1 and CF2 which will be discussed below. For example, the low-refractive pattern LR may have a refractive index equal to or less than about 1.3. The light-shield grid pattern WG and the low-refractive pattern LR may reduce or prevent crosstalk between neighboring ones of the first and second unit pixels UP1 and UP2.

The first protection layer PL1, the low-refractive pattern LR, and the sidewall of the light-shield grid pattern WG may be covered with a second protection layer PL2. The second protection layer PL2 may include at least one selected from a metal oxide layer, a plasma-enhanced tetraethylorthosilicate (PETEOS) layer, a silicon oxycarbide (SiOC) layer, a silicon oxide (SiO) layer, and a silicon nitride (SiN) layer.

The second protection layer PL2 may be provided thereon with color filters CF1 and CF2. Each of the color filters CF1 and CF2 may have one of blue, green, and red colors. The color filters CF1 and CF2 may be arranged in one of Bayer pattern, 2×2 Tetra pattern, and 3×3 Nona pattern. Alternatively, the color filters CF1 and CF2 may include different colors such as cyan, magenta, or yellow.

A micro-lens array layer ML may be disposed on the color filters CF1 and CF2. The micro-lens array layer ML may include convex lenses that correspondingly overlap the first and second unit pixels UP1 and UP2.

Figure 13:
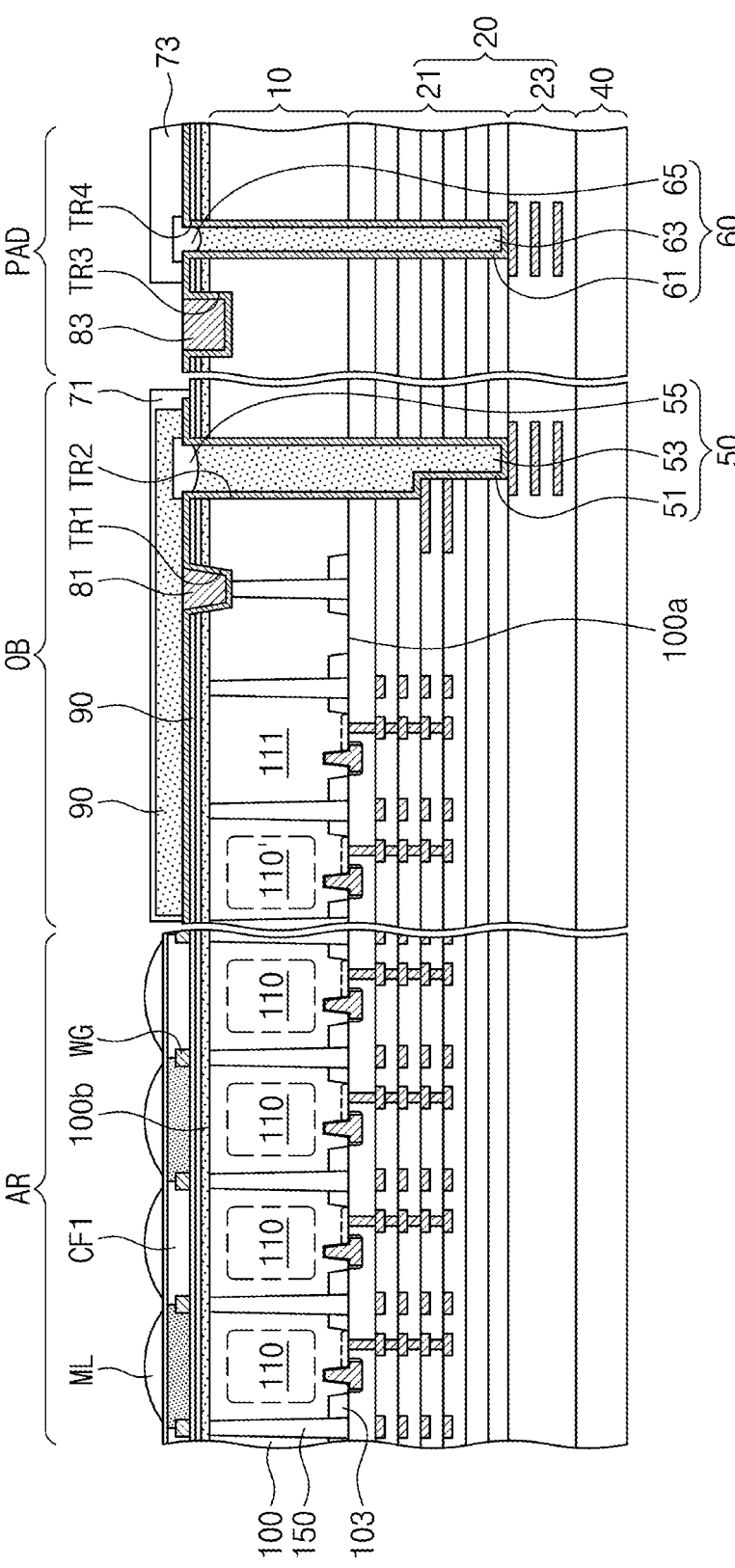
FIG. 13 is a cross-sectional view illustrating an image sensor according to some embodiments of the present inventive concepts.

FIG. 13 is a cross-sectional view illustrating an image sensor according to some embodiments of the present inventive concepts.

Referring to FIG. 13, an image sensor according to some embodiments of the present inventive concepts may include a substrate 100 including a pixel area AR, an optical black area OB, and a pad area PAD, and may also include a wiring layer 20 on a first surface 100a of the substrate 100 and a base substrate 40 on the wiring layer 20. The wiring layer 20 may include an upper wiring layer 21 and a lower wiring layer 23. The pixel area AR may include a plurality of unit pixels UP1 and UP2. The pixel area AR may be substantially the same as that discussed above with reference to FIGS. 8 to 12.

On the optical black area OB, the substrate 100 may be provided thereon with a first connection structure 50, a first conductive pad 81, and a bulk color filter 90. The first connection structure 50 may include a first light-shield pattern 51, a dielectric pattern 53, and a first capping pattern 55.

The first light-shield pattern 51 may be disposed on a second surface 100b of the substrate 100. For example, the first light-shield pattern 51 may cover a second dielectric layer 136 on the second surface 100b, and may also conformally cover an inner wall of a first trench TR1 and an inner wall of a second trench TR2. The first light-shield pattern 51 may penetrate a photoelectric conversion layer 10 and the upper wiring layer 21, and may electrically connect the photoelectric conversion layer 10 to the wiring layer 20. For example, the first light-shield pattern 51 may be in contact with wiring lines in the upper and lower wiring layers 21 and 23 and with a pixel separation part 150 in the photoelectric conversion layer 10. Therefore, the first connection structure 50 may be electrically connected to wiring lines in the wiring layer 20. The first light-shield pattern 51 may include a metallic or metal material, such as tungsten. The first light-shield pattern 51 may block light incident onto the optical black area OB.

A first conductive pad 81 may be provided in the first trench TR1 and may fill a remaining portion of the first trench TR1. The first conductive pad 81 may include a metallic or metal material, such as aluminum. The first conductive pad 81 may be electrically connected to the conductive pattern 113 of FIG. 10. Negative bias voltage may be applied through the first conductive pad 81 to the conductive pattern 113. Therefore, it may be possible to prevent or reduce white spots and/or dark current.

The dielectric pattern 53 may fill a remaining portion of the second trench TR2. The dielectric pattern 53 may penetrate the photoelectric conversion layer 10 and all or a portion of the wiring layer 20. The first capping pattern 55 may be provided on a top surface of the dielectric pattern 53. The first capping pattern 55 may be provided on the dielectric pattern 53.

The bulk color filter 90 may be provided on the first conductive pad 81, the first light-shield pattern 51, and the first capping pattern 55. The bulk color filter 90 may cover the first conductive pad 81, the first light-shield pattern 51, and the first capping pattern 55. A first protection layer 71 may be provided on and cover the bulk color filter 90.

A photoelectric conversion region 110' and a dummy region 111 may be provided on the optical black area OB of the substrate 100. For example, the photoelectric conversion region 110' may be doped with impurities having the second conductivity type different from the first conductivity type. For example, the second conductivity type may be n-type, as examples. The pixel area AR may include a plurality of unit pixel sections. The photoelectric conversion region 110' may have a similar structure to that of a photoelectric conversion region 110 on the pixel area AR, but may be non-functional or may otherwise not perform the same operation (e.g., generation of electrical signals from received light) of the photoelectric conversion region 110. The dummy region 111 may not be doped with impurities. The dummy region 111 may generate signals that are used as information to remove subsequent process noise.

On the pad area PAD, the substrate 100 may be provided thereon with a second connection structure 60, a second conductive pad 83, and a second protection layer 73. The second connection structure 60 may include a second light-shield pattern 61, a dielectric pattern 63, and a second capping pattern 65.

The second light-shield pattern 61 may be disposed on the second surface 100b of the substrate 100. For example, the second light-shield pattern 61 may cover the second dielectric layer 136 on the second surface 100b, and may also conformally cover an inner wall of a third trench TR3 and an inner wall of a fourth trench TR4. The second light-shield pattern 61 may penetrate the photoelectric conversion layer 10 and the upper wiring layer 21, and may electrically connect the photoelectric conversion layer 10 to the wiring layer 20. For example, the second light-shield pattern 61 may be in contact with wiring lines in the lower wiring layer 23. Therefore, the second connection structure 60 may be electrically connected to wiring lines in the wiring layer 20. For example, the second light-shield pattern 61 may include a metallic or metal material, such as tungsten.

A second conductive pad 83 may be provided in the third trench TR3, and may fill a remaining portion of the third trench TR3. The second conductive pad 83 may include a metallic or metal material, such as aluminum. The second conductive pad 83 may serve as an electrical connection path through which an image sensor device is electrically connected to an external apparatus. The dielectric pattern 63 may fill a remaining portion of the fourth trench TR4. The dielectric pattern 63 may penetrate the photoelectric conversion layer 10 and all or a portion of the wiring layer 20. The second capping pattern 65 may be provided on the dielectric pattern 63. The second protection layer 73 may cover the second capping pattern 65 and a portion of the second light-shield pattern 61.

A current applied through the second conductive pad 83 may flow to the pixel separation part 150 through the second light-shield pattern 61, wiring lines in the wiring layer 20, and the first light-shield pattern 51. The photoelectric conversion regions 110 and 110' and the dummy region 111 may generate electrical signals, and the electrical signals may be outwardly transmitted through wiring lines in the wiring layer 20, the second light-shield pattern 61, and the second conductive pad 83.

FIGS. 14 to 21 are cross-sectional views illustrating a method of fabricating an image sensor according to some embodiments of the present inventive concepts. FIGS. 14 to 21 correspond to cross-sections taken along lines A-A' and B-B' of FIG. 1.

Figure 14:
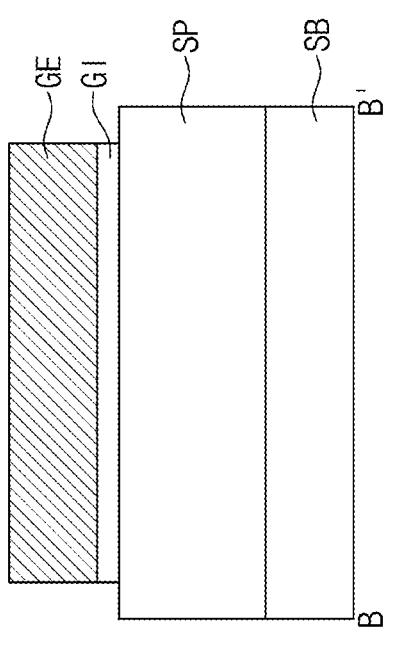
Figure 14:
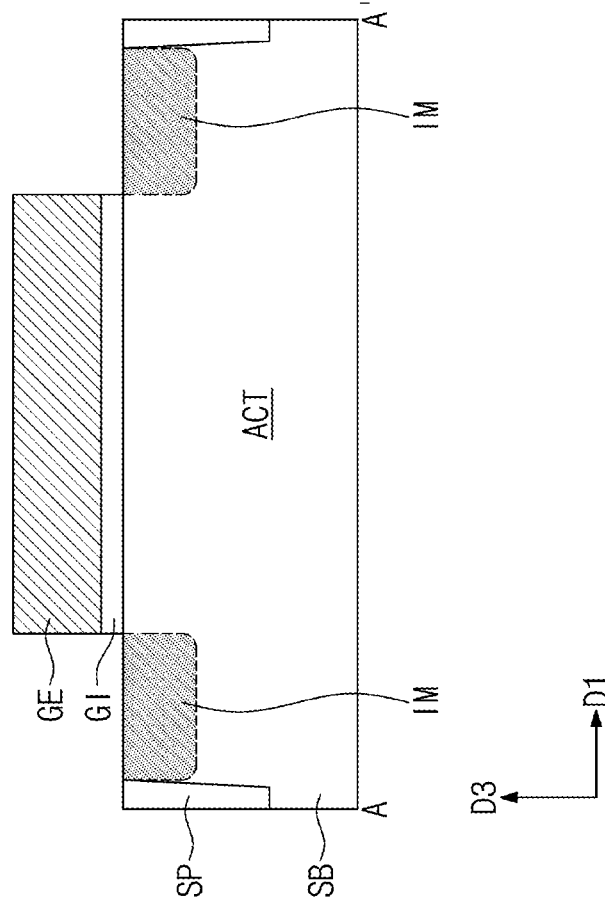

Referring to FIGS. 1 and 14, a substrate SB may undergo typical methods to form a device isolation part SP, a gate dielectric layer GI, a gate electrode GE, and impurity regions IM. For example, the substrate SB may experience a shallow trench isolation (STI) process to form the gate dielectric layer GI. The gate dielectric layer GI and the gate electrode GE may be formed by forming on the substrate SB a sacrificial layer having an opening that exposes an active region ACT defined by the device isolation part SP, forming a dielectric layer that conformally covers an inside of the opening, and then filling the opening with doped polysilicon (or conductive material). Alternatively, a conductive layer may be formed on the substrate SB, and then may be patterned to form the gate dielectric layer GI and the gate electrode GE. In some embodiments, the gate electrode GE may be a source follower gate electrode of an image sensor. For example, an element formed on the substrate SB may be a source follower transistor of the image sensor. The impurity regions IM may be formed by implanting the active region ACT exposed on opposite sides of the gate electrode GE. The present inventive concepts, however, have no limitations on the method of forming the device isolation part SP, the gate dielectric layer GI, the gate electrode GE, and the impurity regions IM, and various processes and methods may be used to form the device isolation part SP, the gate dielectric layer GI, the gate electrode GE, and the impurity regions IM.

Although not shown, before the formation of the gate dielectric layer GI and the gate electrode GE, a photoelectric conversion region and a pixel separation part may be formed. In addition, when the gate electrode GE is a source follower gate electrode, transfer gate electrodes of transfer transistors, a reset gate electrode of a reset transistor, and a selection gate electrode of a selection transistor may be formed simultaneously with the formation of the gate electrode GE.

Referring to FIGS. 1 and 15, a gate protection layer GP may be formed on the substrate SB. For example, the gate protection layer GP may be formed by atomic layer deposition (ALD) or chemical vapor deposition (CVD). The gate protection layer GP may conformally cover the gate electrode GE and a top surface of the substrate SB.

A first sub-dielectric layer ILD1 may be formed on the substrate SB. For example, the first sub-dielectric layer ILD1 may be formed by chemical vapor deposition (CVD). On the gate protection layer GP, the first sub-dielectric layer ILD1 may cover the substrate SB and the gate electrode GE.

Figure 16:
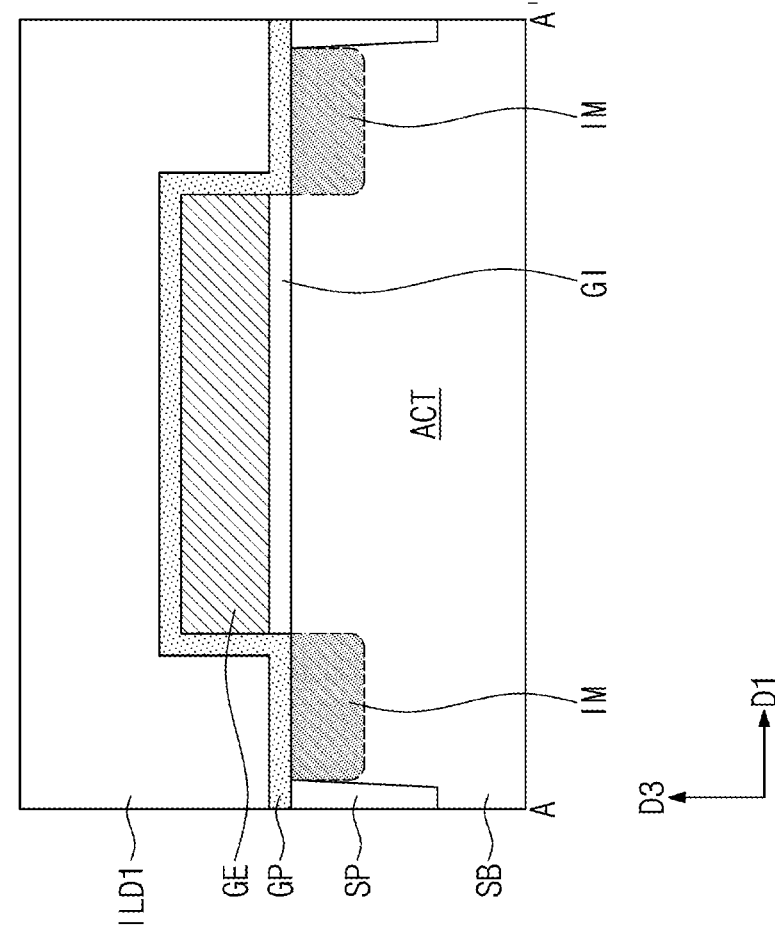
Figure 21:
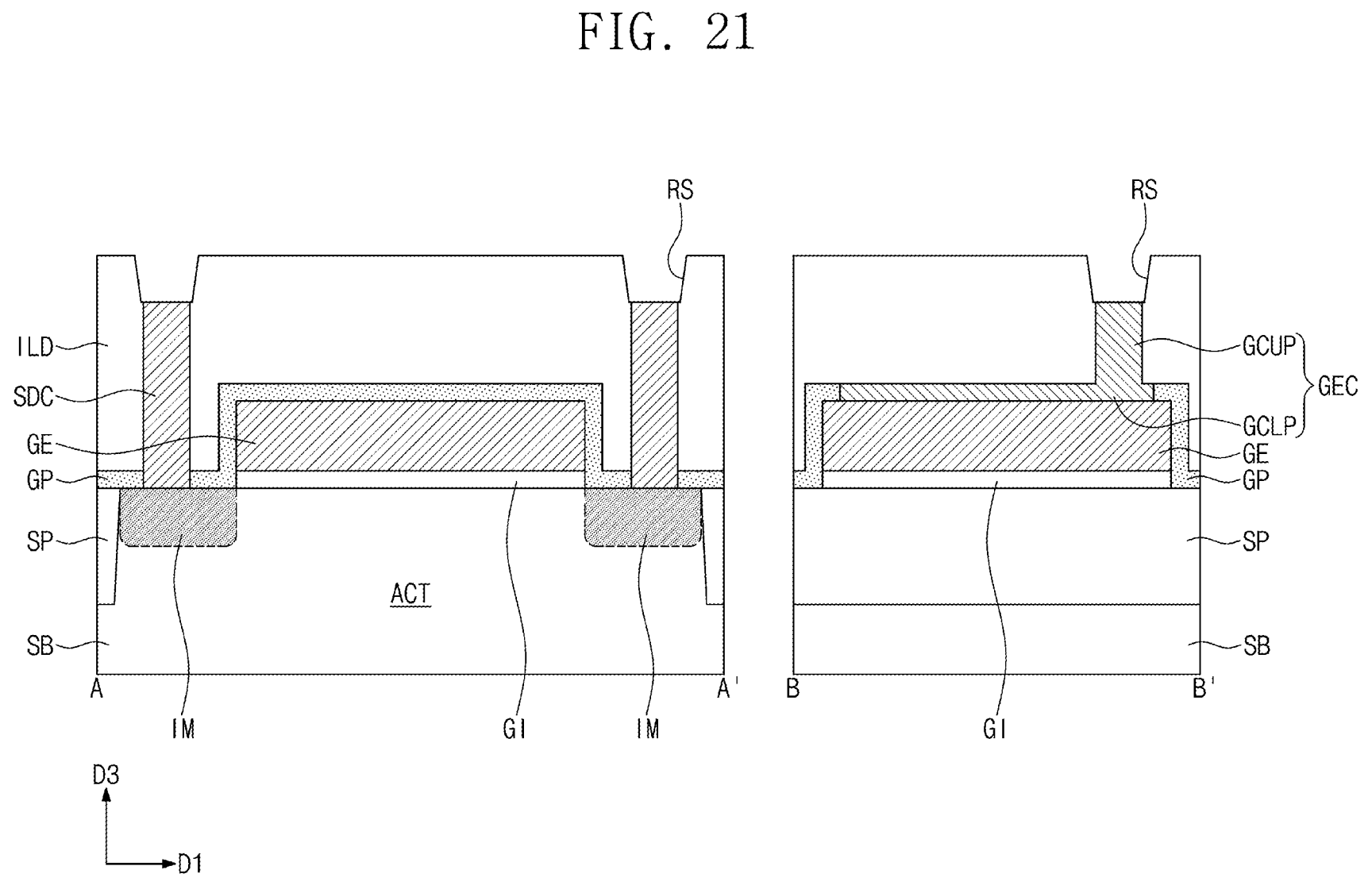

Referring to FIGS. 1 and 16, a patterning process may be performed on the first sub-dielectric layer ILD1 and the gate protection layer GP. The patterning process may form a first opening OP1 that penetrates the first sub-dielectric layer ILD1 and the gate protection layer GP and exposes a top surface of the gate electrode GE. The first opening OP1 may have a planar shape which may conform to that of a lower part GCLP of a gate contact GEC to be formed as illustrated in FIG. 21. For example, a contact area between the gate electrode GE and the lower part GCLP of the gate contact GEC, or an area at the lower part GCLP of the gate contact GEC, may be configured based on a desired or required contact resistance between the gate electrode GE and the lower part GCLP of the gate contact GEC. A planar shape of the first opening OP1 may define the area and the planar shape at the lower part GCLP of the gate contact GEC.

Figure 17:
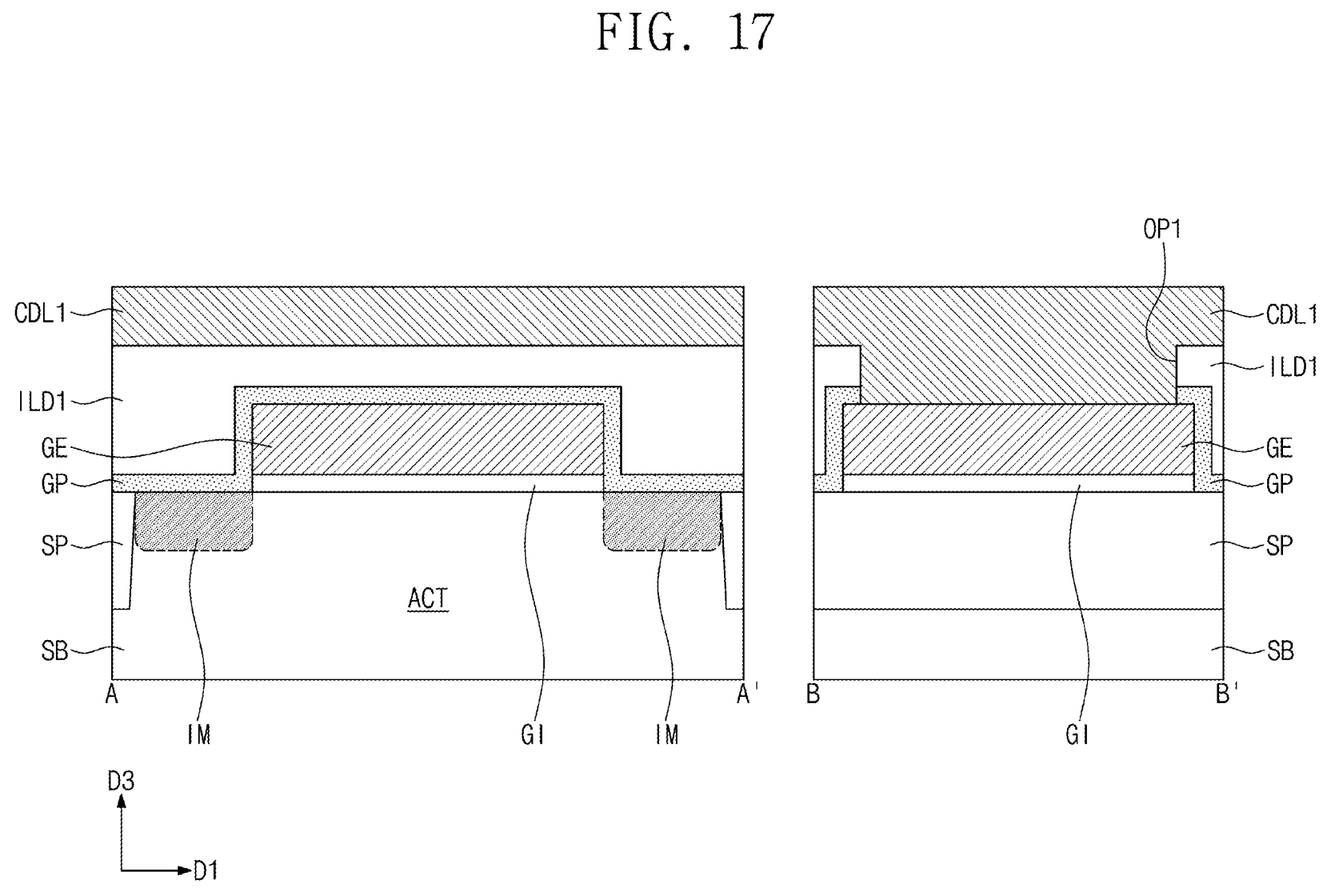

Referring to FIGS. 1 and 17, a first conductive layer CDL1 may be provided on the substrate SB. The first conductive layer CDL1 may be formed by a plating process such as electroplating. For example, a deposition process may be performed to deposit a metallic or metal material on the first sub-dielectric layer ILD1, and the metallic or metal material may fill the first opening OP1. Alternatively, a seed layer may be formed on the first sub-dielectric layer ILD1 to conformally cover a top surface of the first sub-dielectric layer ILD1 and an inner surface of the first opening OP1, and then a plating process may be performed in which the seed layer is used as a seed. The present inventive concepts, however, are not limited thereto, and various methods may be employed to form the first conductive layer CDL1. The first conductive layer CDL1 may cover the top surface of the first sub-dielectric layer ILD1 and may fill the first opening OP1. The first conductive layer CDL1 may include a metallic or metal material, such as tungsten (W) or copper (Cu).

Figure 18:
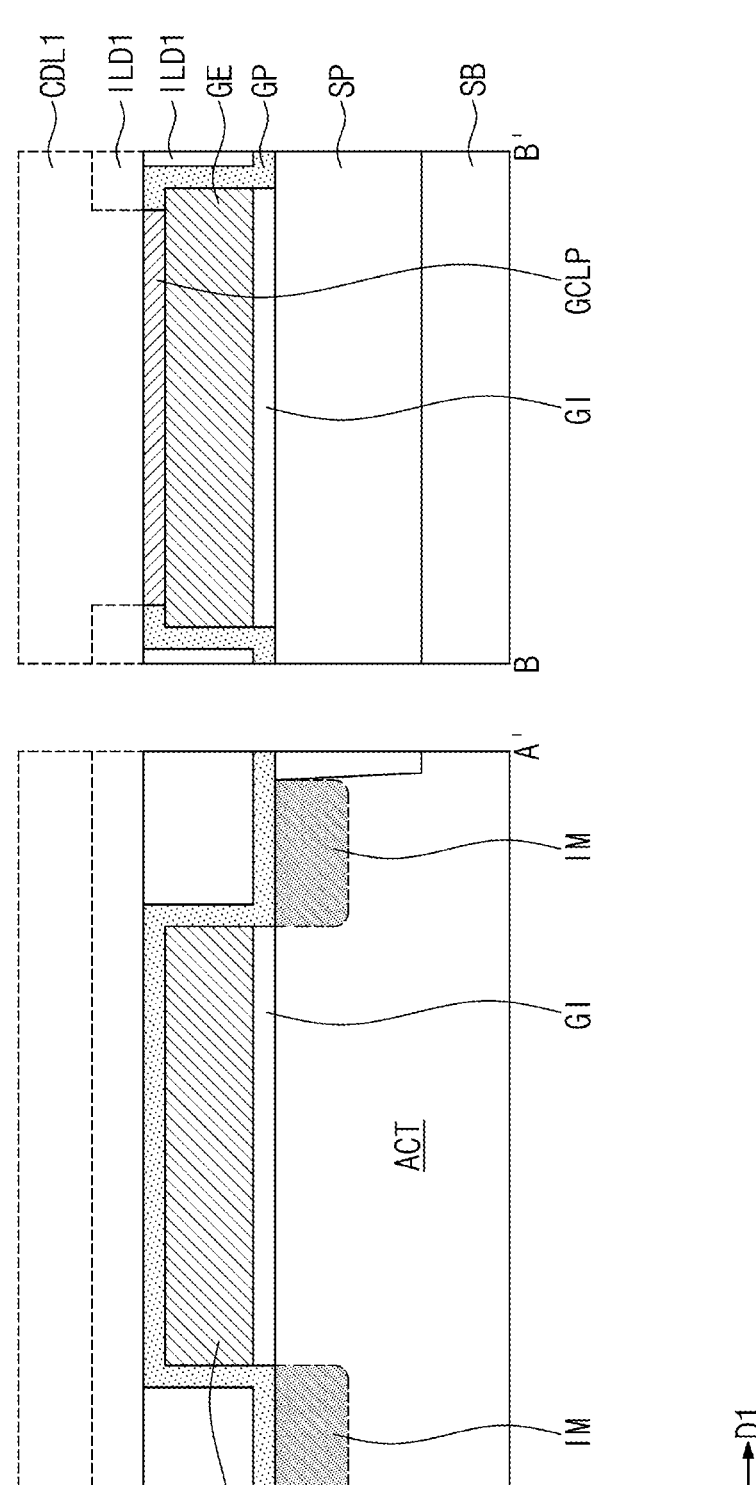

Referring to FIGS. 1 and 18, a back grinding process may be performed on the first conductive layer CDL1. For example, a chemical mechanical polishing (CMP) process may be performed on the first conductive layer CDL1. The back grinding process may continue until a top surface of the gate protection layer GP is exposed. The back grinding process may partially remove the first conductive layer CDL1 on the top surface of the gate protection layer GP and inside the first sub-dielectric layer ILD1, and therefore a first conductive part may be formed in the first opening OP1. The first conductive part may correspond to the lower part GCLP of the gate contact GEC discussed with reference to FIGS. 1 to 4, and in this disclosure, the first conductive part is designated by the same reference symbol GCLP. After the back grinding process, the first conductive part GCLP may have a top surface that is coplanar with that of the first sub-dielectric layer ILD1 and that of the gate protection layer GP.

Figure 19:
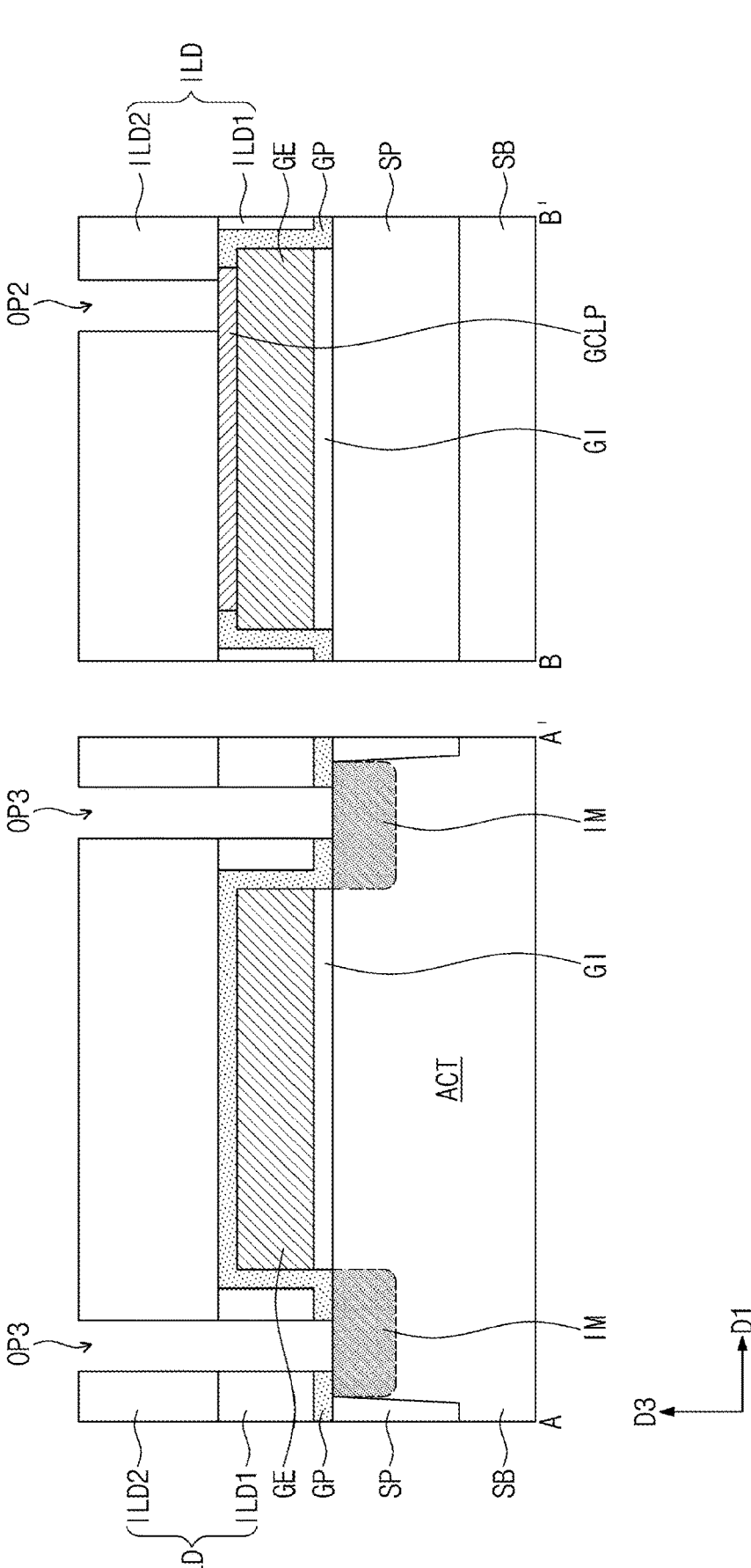

Referring to FIGS. 1 and 19, a second sub-dielectric layer ILD2 may be provided on the first sub-dielectric layer ILD1. For example, the second sub-dielectric layer ILD2 may be formed by chemical vapor deposition (CVD). The second sub-dielectric layer ILD2 may cover the first sub-dielectric layer ILD1, the gate protection layer GP, and the first conductive part GCLP. The first sub-dielectric layer ILD1 and the second sub-dielectric layer ILD2 may constitute an interlayer dielectric layer ILD discussed with reference to FIGS. 1 to 4.

A patterning process may be performed on the second sub-dielectric layer ILD2. The patterning process may be formed a second opening OP2 that penetrates the second sub-dielectric layer ILD2 and exposes the top surface of the first conductive part, and may also form third openings OP3 that penetrate the first sub-dielectric layer ILD1 and the gate protection layer GP and expose top surfaces of the impurity regions IM. The second opening OP2 may have a width less than that of the first opening OP1, or that of the first conductive part GCLP. The first conductive part GCLP may have an area greater than that of the second opening OP2, and thus when the second opening OP2 is formed, no misalignment may be present between the second opening OP2 and the first conductive part GCLP.

Figure 20:
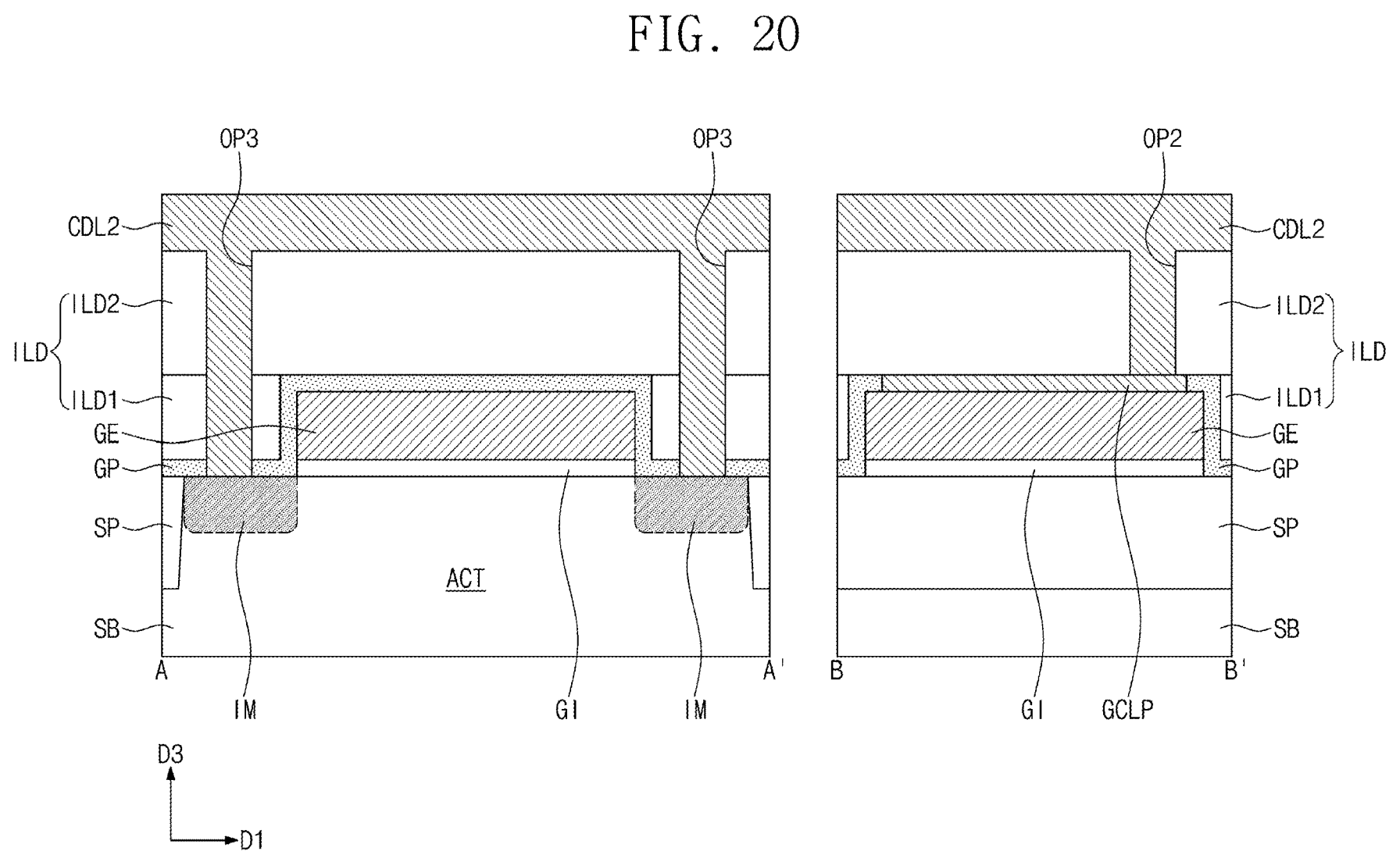

Referring to FIGS. 1 and 20, a second conductive layer CDL2 may be formed on the substrate SB. The second conductive layer CDL2 may be formed by a plating process such as electroplating. For example, a deposition process may be performed to deposit a metallic or metal material on the second sub-dielectric layer ILD2, and the metallic or metal material may fill the second opening OP2 and the third openings OP3. Alternatively, a seed layer may be formed on the second sub-dielectric layer ILD2 to conformally cover a top surface of the second sub-dielectric layer ILD2 and inner surfaces of the third openings OP3, and then a plating process may be performed in which the seed layer is used as a seed. A plating process in which the first conductive part GCLP is used as a seed may be performed in the second opening OP2. When the first conductive part GCLP is used as a seed, the first conductive part GCLP and the second conductive layer CDL2 may be formed into a single or unitary body. Alternatively, like the third openings OP3, a seed layer may be formed to conformally cover an inner surface of the second opening OP2, and then a plating process may be used in which the seed layer is used as a seed. The present inventive concepts are, however, not limited thereto, and various methods may be employed to form the second conductive layer CDL2. The second conductive layer CDL2 may cover the top surface of the second sub-dielectric layer ILD2, and may fill the second opening OP2 and the third openings OP3. The second conductive layer CDL2 may include the same material as that of the first conductive layer CDL1. The second conductive layer CDL2 may include a metallic or metal material, such as tungsten (W) or copper (Cu).

Referring to FIGS. 1 and 21, a back grinding process may be performed on the second conductive layer CDL2. For example, a chemical mechanical polishing (CMP) process may be performed on the second conductive layer CDL2. The back grinding process may continue until the top surface of the second sub-dielectric layer ILD2 is exposed. Therefore, the back grinding process may partially remove the second conductive layer CDL2 on the top surface of the second sub-dielectric layer ILD2, and thus a second conductive part may be formed in the second opening OP2 and source/drain contacts SDC may be formed in the third openings OP3. The second conductive part may correspond to the upper part GCUP of the gate contact GEC discussed with reference to FIGS. 1 to 4, and in this disclosure, the second conductive part is designated by the same reference symbol GCUP. The first conductive part GCLP and the second conductive part GCUP may be physically and electrically connected to each other. The first conductive part GCLP and the second conductive part GCUP may constitute a gate contact GEC.

According to some embodiments of the present inventive concepts, the lower part GCLP of the gate contact GEC may be formed such that a larger contact area may be provided between the gate electrode GE and the lower part GCLP of the gate contact GEC (as compared with the contact area of the upper part GCUP), with the result that an image sensor may be fabricated to have improved electrical properties. In addition, when the lower and upper parts GCLP and GCUP of the gate contact GEC are formed into a single or unitary body, an interfacial resistance may be absent in the gate contact GEC and a reduced or extremely small electrical resistance may be present between the gate electrode GE and wiring lines WL which will be discussed below. Accordingly, it may be possible to fabricate an image sensor having increased or improved electrical properties.

Afterwards, an etch-back process may be performed on the gate contact GEC and the source/drain contacts SDC. The etch-back process may form recesses RS on the top surface of the second sub-dielectric layer ILD2 or of the interlayer dielectric layer ILD. The gate contact GEC and the source/drain contacts SDC may be exposed on bottom surfaces of the recesses RS. The gate contact GEC and the source/drain contacts SDC may have their top surfaces lower than that of the second sub-dielectric layer ILD2.

Referring to FIGS. 1 and 2, vias VI and wiring lines WL may be formed on the interlayer dielectric layer ILD. For example, a conductive material may be deposited on the interlayer dielectric layer ILD to cover a top surface of the interlayer dielectric layer ILD and to fill the recesses RS, and then the conductive layer may be patterned to form the vias VI in the recesses RS and to form the wiring lines WL on the interlayer dielectric layer ILD. Alternatively, the vias VI and the wiring lines WL may be formed independently from each other. For example, the recesses RS may be filled with a conductive material to form the vias VI, and thereafter the wiring lines WL may be formed on the interlayer dielectric layer ILD.

An intermetal dielectric layer IMD may be formed on the interlayer dielectric layer ILD. The intermetal dielectric layer IMD may be formed to cover the wiring lines WL.

As such, an image sensor may be fabricated which is discussed with reference to FIGS. 1 to 4.

For an image sensor according to some embodiments of the present inventive concepts, a gate electrode and a lower part of a gate contact may have therebetween a larger contact area and a smaller contact resistance e.g., in comparison to an upper part of the gate contact. Accordingly, the image sensor may increase or improve in electrical properties.

Moreover, the image sensor may be configured such that an upper part of the gate contact may occupy a smaller planar area than the lower part of the gate contact, and that smaller line-widths and narrower intervals may be provided for wiring lines and vias connected onto the upper part of the gate contacts. Thus, the wiring lines may increase in integration, and the image sensor may decrease in size.

Furthermore, the lower and upper parts of the gate contact may be formed to have different shapes from each other to constitute a single or unitary body, and thus no or reduced interfacial resistance may be present in the gate contact, and a reduced or extremely small electrical resistance may be provided between the gate electrode and the wiring lines. In conclusion, the image sensor may be provided with increased or improved electrical properties.

Although the present inventive concepts have been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. An image sensor, comprising:
an active region;
a first photoelectric conversion element;
a second photoelectric conversion element;
a floating diffusion region connected to the first and second photoelectric conversion elements;
a first transfer transistor between the first photoelectric conversion element and the floating diffusion region;
a second transfer transistor between the second photoelectric conversion element and the floating diffusion region;
a source follower transistor connected to the floating diffusion region and comprising a gate electrode on the active region;
a gate protection layer on the gate electrode in a vertical view;
a gate contact comprising a lower part connecting to the gate electrode and an upper part,
wherein the lower part comprises:
a first surface in contact with the gate protection layer in the vertical view; and a second surface opposing the first surface of the lower part in the vertical view and in contact with the gate protection layer in the vertical view,
wherein the lower part comprises:
a bottom surface connecting to the gate electrode; and
a top surface opposing the bottom surface of the lower part in the vertical view,
wherein an area of the top surface of the lower part in a plan view is about 1.5 times to about 10 times to an area of the upper part in the plan view,
wherein the first transfer transistor and the second transfer transistor are arranged in a first direction in the plan view, and
wherein the lower part extends in a second direction perpendicular to the first direction in the plan view.

2. The image sensor of claim 1, wherein the lower part and the upper part are made of a same material.

3. The image sensor of claim 2, wherein the lower part and the upper part comprise a metal material.

4. The image sensor of claim 1, further comprising:
a wiring line vertically overlapping with the upper part in the plan view,
wherein the wiring line extends in a third direction different from the first and second directions in the plan view.

5. The image sensor of claim 1, further comprising:
a substrate comprising a first surface and a second surface opposing the first surface of the substrate,
wherein the first transfer transistor extends into the substrate from the first surface of the substrate.

6. The image sensor of claim 5, further comprising:
a pixel separation part in contact with the second surface of the substrate.

7. The image sensor of claim 6, wherein the pixel separation part penetrates the substrate.

8. The image sensor of claim 1, wherein an area of the gate electrode in the plan view is more than 2 times greater than the area of the lower part in the plan view.

9. The image sensor of claim 8, wherein the upper part is offset from a center of the gate electrode in the plan view.

10. The image sensor of claim 8, wherein the upper part is offset from a center of the lower part in the plan view.

11. An image sensor, comprising:
an active region;
a first photoelectric conversion element;
a second photoelectric conversion element;
a floating diffusion region connected to the first and second photoelectric conversion elements;
a first transfer transistor between the first photoelectric conversion element and the floating diffusion region;
a second transfer transistor between the second photoelectric conversion element and the floating diffusion region;
a reset transistor connected to the floating diffusion region;
a source follower transistor connected to the floating diffusion region and comprising a gate electrode on the active region;
a selection transistor connected to the source follower transistor;
a gate protection layer on the gate electrode in a vertical view;
a gate contact comprising a lower part connecting to the gate electrode and an upper part,
wherein the lower part comprises:

a first surface in contact with the gate protection layer in the vertical view; and a second surface opposing the first surface of the lower part in the vertical view and in contact with the gate protection layer in the vertical view, wherein the lower part comprises:

a bottom surface connecting to the gate electrode; and a top surface opposing the bottom surface of the lower part in the vertical view, wherein an area of the top surface of the lower part in a plan view is about 1.5 times to about 10 times to an area of the upper part in the plan view, wherein a distance from the first transfer transistor to the second transfer transistor in a first direction in the plan view is less than a distance from a reset gate electrode of the reset transistor to the gate electrode in the first direction in the plan view.

12. The image sensor of claim 11, wherein the reset gate electrode of the reset transistor and a selection gate electrode of the selection transistor are arranged in a second direction perpendicular to the first direction in the plan view.

13. The image sensor of claim 11, wherein an area of the gate electrode in the plan view is greater than an area of the reset gate electrode of the reset transistor.

14. The image sensor of claim 11, wherein an area of the gate electrode in the plan view is greater than an area of the selection gate electrode of the selection transistor.

15. The image sensor of claim 14, wherein the upper part is offset from a center of the gate electrode in the plan view.

16. The image sensor of claim 14, wherein the upper part is offset from a center of the lower part in the plan view.

17. The image sensor of claim 11, wherein the lower part and the upper part are made of a same material.

18. The image sensor of claim 11, further comprising:

a wiring line vertically overlapping with the upper part in the plan view, wherein the wiring line extends in a third direction different from the first and second directions in the plan view.

19. An image sensor, comprising:

an active region;

a first photoelectric conversion element;

a second photoelectric conversion element;

a floating diffusion region connected to the first and second photoelectric conversion elements;

a first transfer transistor between the first photoelectric conversion element and the floating diffusion region;

a second transfer transistor between the second photoelectric conversion element and the floating diffusion region;

a source follower transistor connected to the floating diffusion region and comprising a gate electrode on the active region;

a gate protection layer on the gate electrode in a vertical view;

a gate contact comprising a lower part connecting to the gate electrode and an upper part, wherein the lower part comprises:

a first surface in contact with the gate protection layer in the vertical view; and a second surface opposing the first surface of the lower part in the vertical view and in contact with the gate protection layer in the vertical view, wherein the lower part comprises:

a bottom surface connecting to the gate electrode; and a top surface opposing the bottom surface of the lower part in the vertical view, wherein an area of the top surface of the lower part in a plan view is about 1.5 times to about 10 times to an area of the upper part in the plan view, wherein the first transfer transistor and the second transfer transistor are arranged in a first direction in the plan view, and wherein the upper part does not overlap with the active region in the plan view.

20. The image sensor of claim 19, wherein the upper part is offset from a center of the lower part in the plan view.

* * * * *